US008766331B2

(12) United States Patent
Okita

(10) Patent No.: US 8,766,331 B2
(45) Date of Patent: Jul. 1, 2014

(54) POWER SEMICONDUCTOR MODULE

(75) Inventor: Souichi Okita, Nagano (JP)

(73) Assignee: Fuji Electric Co., Ltd. (JP)

(*) Notice: Subject to any disclaimer, the term of this patent is extended or adjusted under 35 U.S.C. 154(b) by 275 days.

(21) Appl. No.: 13/295,454

(22) Filed: Nov. 14, 2011

(65) Prior Publication Data

US 2012/0119256 A1 May 17, 2012

(30) Foreign Application Priority Data

Nov. 16, 2010 (JP) .................................. 2010-255765

(51) Int. Cl.
H01L 29/66 (2006.01)
H01L 29/739 (2006.01)

(52) U.S. Cl.
CPC .................................. H01L 29/7393 (2013.01)
USPC .................................. 257/273; 257/E29.197

(58) Field of Classification Search
CPC .................. H01L 2924/13055; H01L 29/7393
USPC .................... 257/140, 273, E29.197; 438/135
See application file for complete search history.

(56) References Cited

U.S. PATENT DOCUMENTS

2010/0039843 A1 2/2010 Takizawa
2011/0242860 A1* 10/2011 Takizawa et al. .............. 363/62
2011/0242866 A1* 10/2011 Takizawa ...................... 363/131
2012/0018777 A1* 1/2012 Takizawa ...................... 257/140

FOREIGN PATENT DOCUMENTS

JP 2008-193779 A 8/2008

* cited by examiner

Primary Examiner — William F Kraig
Assistant Examiner — Joseph C Nicely
(74) Attorney, Agent, or Firm — Rossi, Kimms & McDowell, LLP

(57) ABSTRACT

In a semiconductor module according to certain aspects the invention, a U-terminal and an M-terminal overlap each other in a manner to reduce inductance and to further to reduce the size of snubber capacitor. In certain aspects of the invention, a P-terminal, M-terminal, N-terminal, and U-terminal are arranged such that the U-terminal, through which currents flow in and out, is arranged farthest away from control electrodes to reduce the noises superposed to control electrodes, and the P-terminal, M-terminal, N-terminal, and U-terminal are aligned to facilitate attaching external connection bars thereto. A power semiconductor module according to aspects of the invention can facilitate reducing the wiring inductance inside and outside the module, reducing the electromagnetic noises introduced into the control terminals, and attaching the external wirings to the terminals thereof simply and easily.

7 Claims, 22 Drawing Sheets

POWER SEMICONDUCTOR MODULE

BACKGROUND OF THE INVENTION

1. Field of the Invention

Embodiments of the present invention relate to power semiconductor modules used in three-level inverters and resonance-type inverters.

2. Description of Related Art

FIG. 18 is the circuit diagram of a three-level inverter that converts a direct current ("DC") to an alternating current ("AC") using a conventional technique.

The circuit configuration shown in FIG. 18 is disclosed in Japanese Unexamined Patent Application Publication No. 2008-193779, also referred to herein as "Patent Document 1." DC power supplies 41 and 42 are connected in series to each other. In FIG. 18, positive electrode potential P, negative electrode potential N, and neutral point potential M are described. If one wants to configure the DC power supply from an AC power supply system, it is possible to configure the DC power supply using a diode rectifier and a large-capacity electrolytic capacitor, which are not shown.

Series connection circuits of Insulated-Gate Bipolar Transistors ("IGBT's"), each including an IGBT and a diode connected in opposite parallel to the IGBT, are connected for the three phases between positive electrode potential P and negative electrode potential N. In detail, series connection circuit 60 for the U-phase includes an upper arm including IGBT 111 and diode 112 connected in opposite parallel to IGBT 111 and a lower arm including IGBT 113 and diode 114 connected in opposite parallel to IGBT 113. Series connection circuit 61 for the V-phase includes an upper arm including IGBT 121 and diode 122 connected in opposite parallel to IGBT 121 and a lower arm including IGBT 123 and diode 124 connected in opposite parallel to IGBT 123. Series connection circuit 62 for the V-phase includes an upper arm including IGBT 131 and diode 132 connected in opposite parallel to IGBT 131 and a lower arm including IGBT 133 and diode 134 connected in opposite parallel to IGBT 133.

An AC switch including an opposite series connection of IGBT's, to each of which a diode is connected in opposite parallel, is connected between the series connection point of the upper and lower arms in the series connection for each phase and neutral point potential M of the DC power supply.

In detail, IGBT module 63 includes IGBT 81 and diode 82 connected in opposite parallel to IGBT 81. IGBT module 64 includes IGBT 83 and diode 84 connected in opposite parallel to IGBT 83. An AC switch circuit, in which the emitter of IGBT module 63 and the emitter of IGBT module 64 are connected to each other, is connected between the series connection point in series connection circuit 60 for the U-phase and neutral point potential M of the DC power supply.

IGBT module 65 includes IGBT 85 and diode 86 connected in opposite parallel to IGBT 85. IGBT module 66 includes IGBT 87 and diode 88 connected in opposite parallel to IGBT 87. An AC switch circuit, in which the emitter of IGBT module 65 and the emitter of IGBT module 66 are connected to each other, is connected between the series connection point in series connection circuit 61 for the V-phase and neutral point potential M of the DC power supply.

IGBT module 67 includes IGBT 89 and diode 90 connected in opposite parallel to IGBT 89. IGBT module 68 includes IGBT 91 and diode 92 connected in opposite parallel to IGBT 91. An AC switch circuit, in which the emitter of IGBT module 67 and the emitter of IGBT module 68 are connected to each other, is connected between the series connection point in series connection circuit 62 for the W-phase and neutral point potential M of the DC power supply.

The series connection points in series connection circuits 60, 61, and 62 feed AC outputs, which are connected to load 74 via reactors 71, 72 and 73 working for filters, respectively.

In the circuit configuration shown in FIG. 18, it is possible for the series connection points in series connection circuits 60, 61, and 62 to output positive electrode potential P, negative electrode potential N, and neutral point potential M, respectively. Therefore, the circuit shown in FIG. 18 feeds three-level inverter outputs. FIG. 19 is the output voltage (Vout) waveform from the circuit shown in FIG. 18. In contrast to the two-level-type inverter, the three-level inverter shown in FIG. 18 is featured specifically by the AC voltage outputted therefrom which contains three voltage levels with a few low-order higher harmonic components. Therefore, the three-level inverter circuit shown in FIG. 18 facilitates reducing the size of output filters 71 through 73.

When the three-level inverter described above is configured by the presently available IGBT modules, a 2-in-1-type IGBT module will be employed for the series connection circuits 60 through 62 and a 1-in-1-type IGBT module for IGBT modules 63 through 68.

FIG. 20(a) describes the current paths in the three-level inverter shown in FIG. 18 made to operate with power supply 41. FIG. 20(b) describes the current paths in the three-level inverter shown in FIG. 18 made to operate with power supply 42.

In FIG. 20(a), current 151 fed from the high-potential-side of power supply 41 flows to load 74 via IGBT 111 on the upper arm. Current 151 returns to the low-potential-side of power supply 41 from load 74 via a V-terminal and intermediate devices 87 and 86. In the current path, current 151 flows from the V-terminal to intermediate devices 87 and 86 and, then, flows from intermediate devices 87 and 86 to an M-terminal.

In the regenerating operation mode, current 152 that flows from load 74 flows to the high-potential-side of power supply 41 via FWD 122 on the upper arm. Current 152 that flows into load 74 flows from the low-potential-side of power supply 41 to intermediate devices 81 and 84 and, then, flows from intermediate devices 81 and 84 into load 74 via a U-terminal. In this case, current 152 flows from the M-terminal to intermediate devices 81 and 84 and, then, flows from intermediate devices 81 and 84 to load 74 via the U-terminal.

In any case, currents 151 and 152 which flow through the intermediate devices flow through the route connected to load 74 via the V- and U-terminals.

In FIG. 20(b), current 153 fed from the high-potential-side of power supply 42 flows to load 74 through intermediate devices 81 and 84 and the U-terminal and returns from load 74 to the low-potential-side of power supply 42 via IGBT 123 on the lower arm. In this current path, current 153 flows from the M-terminal to intermediate devices 81 and 84 and, then, flows from intermediate devices 81 and 84 into load 74 via the U-terminal.

In the regenerating operation mode, current 154 that flows from load 74 flows to the high-potential-side of power supply 42 via the V-terminal and intermediate devices 87 and 86. Current 154 that flows into load 74 flows from the low-potential-side of power supply 42 via FWD 114 on the lower arm to load 74. In this case, current 154 flows from load 74 to intermediate devices 87 and 86 via the V-terminal and, then, flows from intermediate devices 87 and 86 to the M-terminal.

In any case, currents 153 and 154 which flow through the intermediate devices flow through the route connected to load 74 via the V- and U-terminals.

FIG. 21 describes the current paths in the three-level inverter shown in FIG. 18 made to operate with power supplies 41 and 42.

Since any of the intermediate devices is not involved in the operations in this case, any current does not flow through the paths which connect the M-terminal and load 74 via the U-terminal, the V-terminal, or the W-terminal.

It is necessary to provide power semiconductor module 300 shown in FIG. 18 with conductors which connect power supplies 41 and 42 with IGBT modules 60, 63 and 64. In power semiconductor module 300, many conductors are used, conductors having complicated shapes are necessary, and large mutual inductance and large self-inductance are caused.

To obviate the problem described above, Patent Document 1 discloses the technique that shortens the wirings between the IGBT's as described in connection with power semiconductor module 300 to reduce the self-inductance. The technique disclosed in the Patent Document 1 integrates the series IGBT connection circuit connected to the positive and negative electrode potentials P and N and the IGBT's working as the AC switch connected between the series connection point in the series IGBT connection circuit and the neutral potential point M of the DC power supply into a monolithic IGBT module.

However, Patent Document 1 does not describe any thing on the technique for reducing the wiring inductance between the IGBT's in the module.

Although Patent Document 1 indicates the alignment of the terminals which constitute the module, Patent Document 1 does not define the alignment order of the terminals nor does it describe the reduction of the wiring inductance in the module.

In view of the foregoing, it would be desirable to obviate the problems described above. It would be also desirable to provide, with low manufacturing costs, a power semiconductor module that facilitates reducing the mutual inductance therein, reducing the electromagnetic noises introduced into the control terminals thereof, and attaching external wirings to the terminals thereof simply and easily.

SUMMARY OF THE INVENTION

According to embodiments of the invention, there is provided a power semiconductor module including: a first power supply; a second power supply; a first circuit including a first IGBT and a first diode connected in opposite parallel to each other, the first circuit constituting an upper arm; a second circuit including a second IGBT and a second diode connected in opposite parallel to each other, the second circuit constituting a lower arm; an intermediate circuit including a first reverse blocking IGBT and a second reverse blocking IGBT connected in opposite parallel to each other; the first power supply and the second power supply being connected in series to each other at a first connection point; the first end of the first circuit being connected to the high-potential-side of the first power supply at a second connection point; the second end of the first circuit, the second circuit, and the intermediate circuit being connected to a load at a third connection point; the second circuit being connected to the low-potential-side of the second power supply at a fourth connection point;

a case; a control terminal, the control terminals being connected to the gates of the first IGBT, the second IGBT, the first reverse blocking IGBT, and the second reverse blocking IGBT; an output terminal connecting the third connection point, the collector of the first reverse blocking IGBT, and the emitter of the second reverse blocking IGBT to each other; an intermediate terminal connecting the first connection point, the emitter of the first reverse blocking IGBT, and the collector of the second reverse blocking IGBT to each other; and the output terminal and the intermediate terminal overlapping each other in the case.

According to some embodiments, the power semiconductor module can include a P-terminal connecting the first connection point, the collector of the first IGBT, and the cathode of the first diode to each other; an N-terminal connecting the fourth connection point, the emitter of the second IGBT and the anode of the second diode; an M-terminal working as the intermediate terminal; and a U-terminal, a V-terminal, or a W-terminal working as the output terminal.

According to some embodiments, the power semiconductor module can include a P-terminal connecting the first connection point, the collector of the first IGBT, and the cathode of the first diode to each other, the P-terminal including a connector end section exposed outside the case; an N-terminal connecting the fourth connection point, the emitter of the second IGBT and the anode of the second diode, the N-terminal including a connector end section exposed outside the case; an M-terminal working as the intermediate terminal, the M-terminal including a connector end section exposed outside the case; a U-terminal, a V-terminal, or a W-terminal working as the output terminal, the output terminal including a connector end section exposed outside the case; and the exposed connector end sections of the P-terminal, the M-terminal, the N-terminal, and the output terminal being arranged farther away from the control terminals in the order of the description.

According to some embodiments, the connector end sections of the P-terminal, the M-terminal, the N-terminal, and the output terminal are aligned farther away from the control terminals in the order of the description.

According to some embodiments, the power semiconductor module further includes a P-terminal connecting the first connection point, the collector of the first IGBT, and the cathode of the first diode to each other, the P-terminal including a connector end section exposed outside the case; an N-terminal connecting the fourth connection point, the emitter of the second IGBT and the anode of the second diode, the N-terminal including a connector end section exposed outside the case; an M-terminal working as the intermediate terminal, the M-terminal including a connector end section exposed outside the case; a U-terminal, a V-terminal, or a W-terminal working as the output terminal, the output terminal including a connector end section exposed outside the case; the exposed connector end sections of the N-terminal, the M-terminal, and the P-terminal being arranged farther away from the control terminals in the order of the description; the exposed connector end sections of the N-terminal, the M-terminal, and the P-terminal being aligned; and the exposed connector end section of the output terminal being arranged beside the exposed connector end section of the P-terminal.

By arranging the output terminal and the M-terminal such that the output terminal and the M-terminal are overlapping each other in the case, the mutual inductance in the case can be reduced and, therefore, the size of the snubber capacitor can be reduced.

By arranging the P-terminal, the M-terminal, and the N-terminal outside the case in the order of the above description, the mutual inductance of the external connection bars connected to the terminals can be reduced.

By arranging the output terminal (e.g., the U-terminal), through which currents flow in and out, farther than the other terminals away from the control terminals and by aligning the P-terminal, the M-terminal, the N-terminal, and the output terminal, the electromagnetic noises superposed to the control terminals can be reduced and it can becomes easier to attach the external connection bars.

BRIEF DESCRIPTIONS OF THE DRAWINGS

Figure 18:
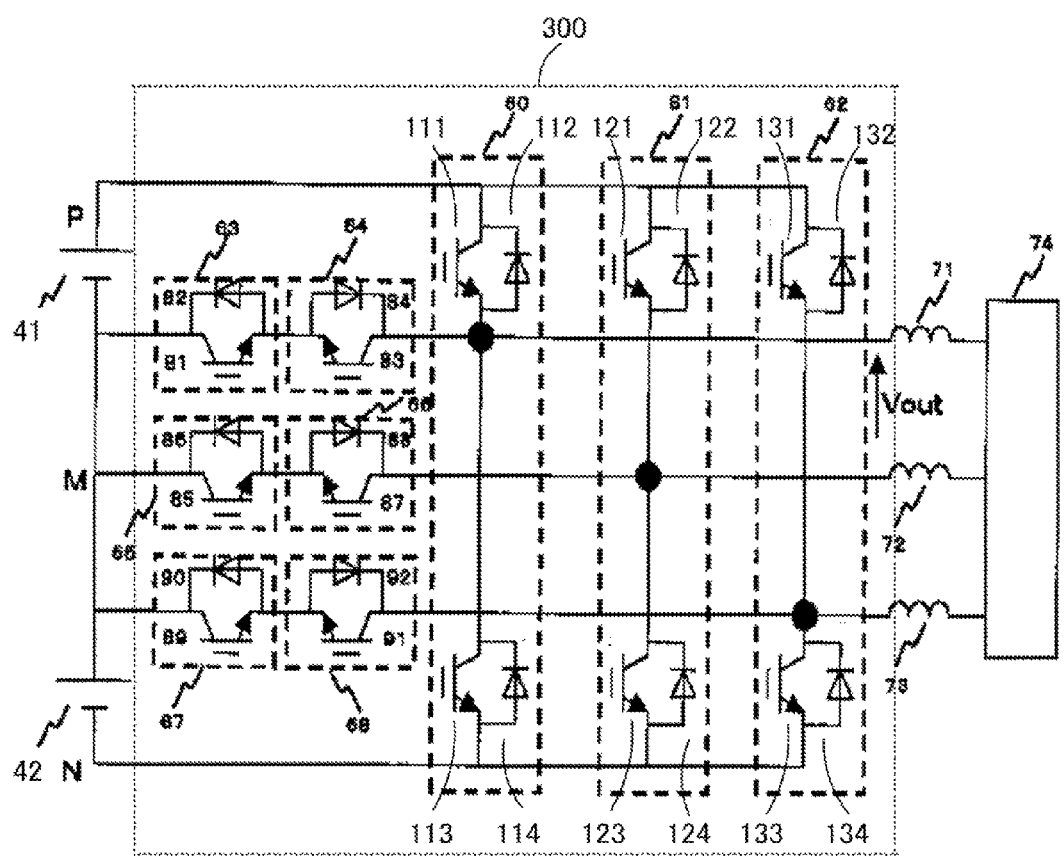
FIG. 18 is the circuit diagram of a three-level inverter that converts a DC to an AC using a conventional technique.
Figure 19:
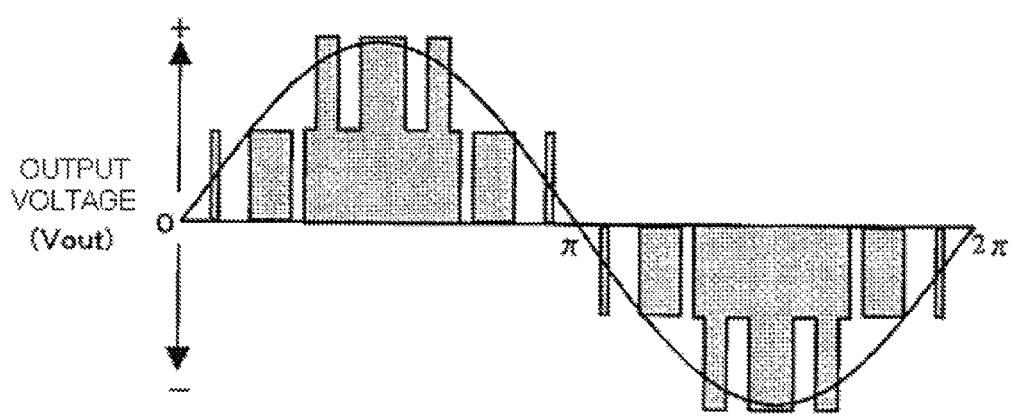
FIG. 19 is the output voltage (Vout) waveform from the circuit shown in FIG. 18.
Figure 20:
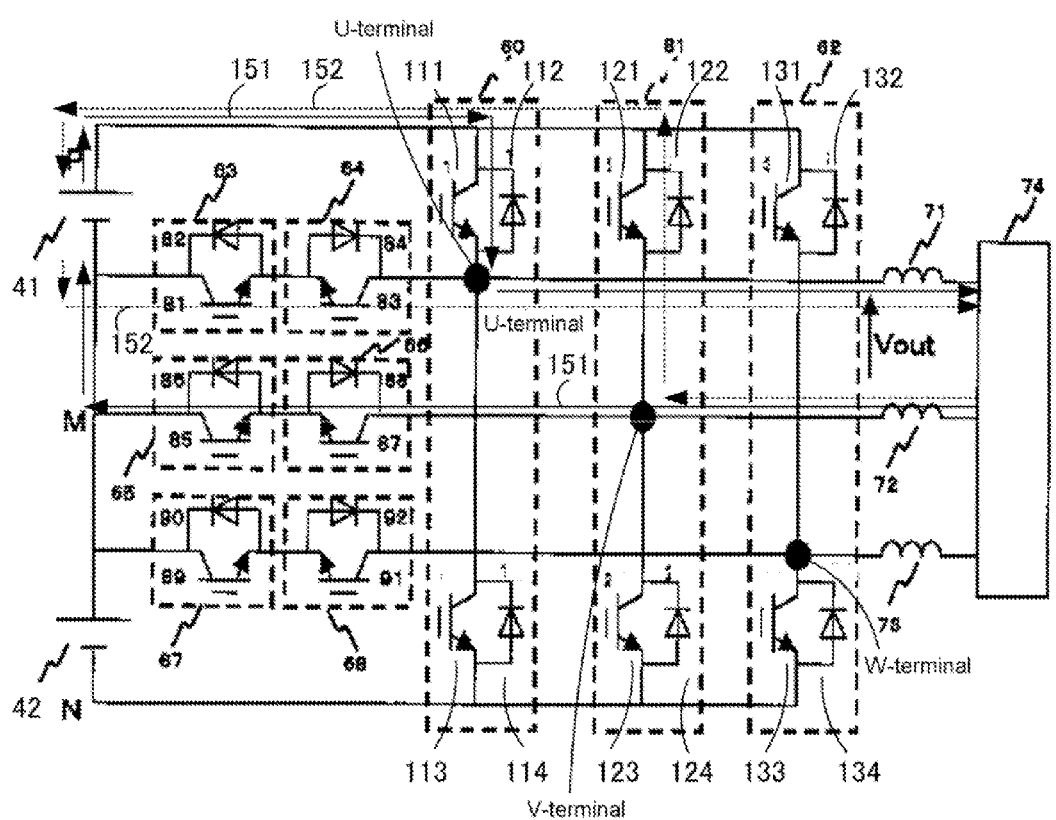
Figure 20:
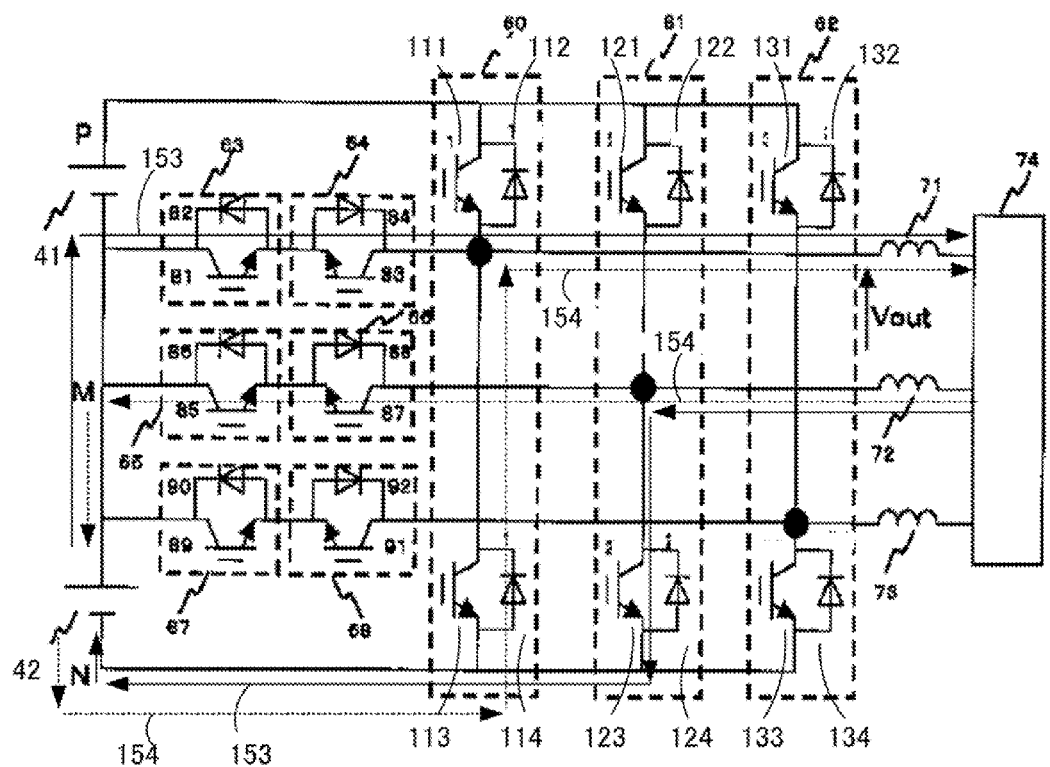
Figure 21:
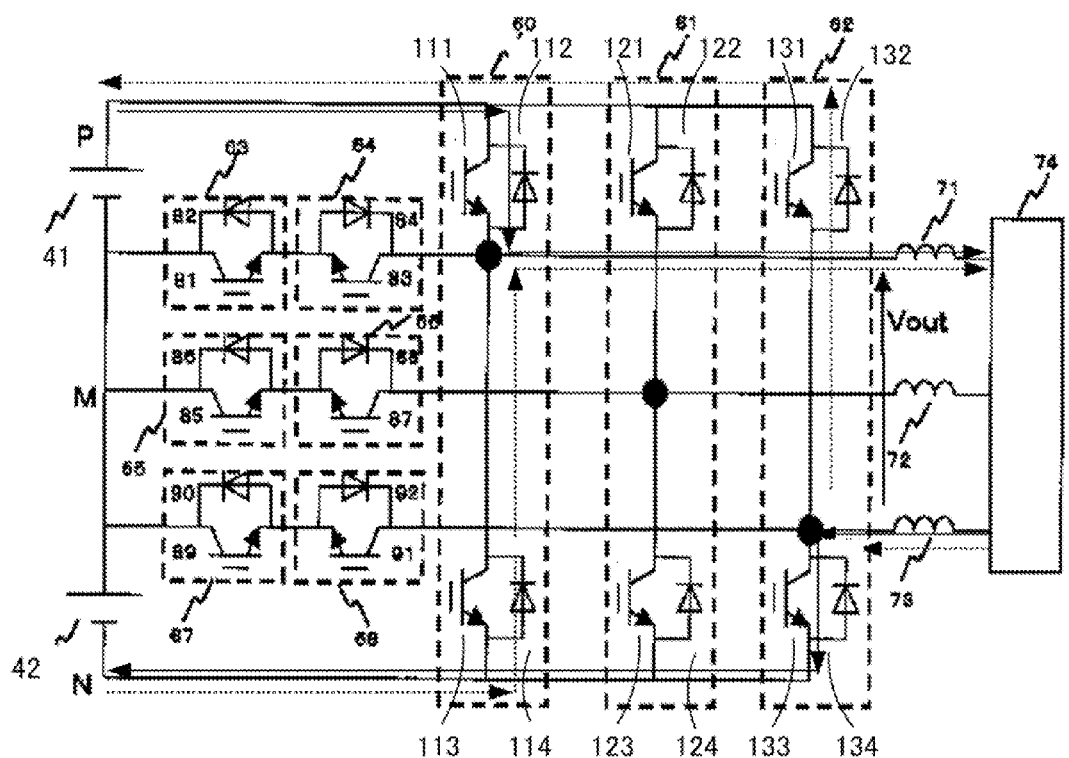
Figure 22:
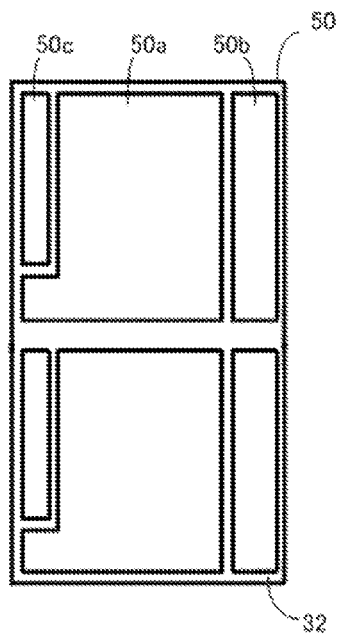
Figure 22:
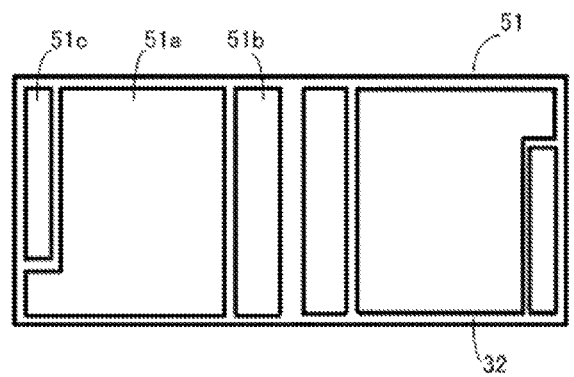
Figure 22:
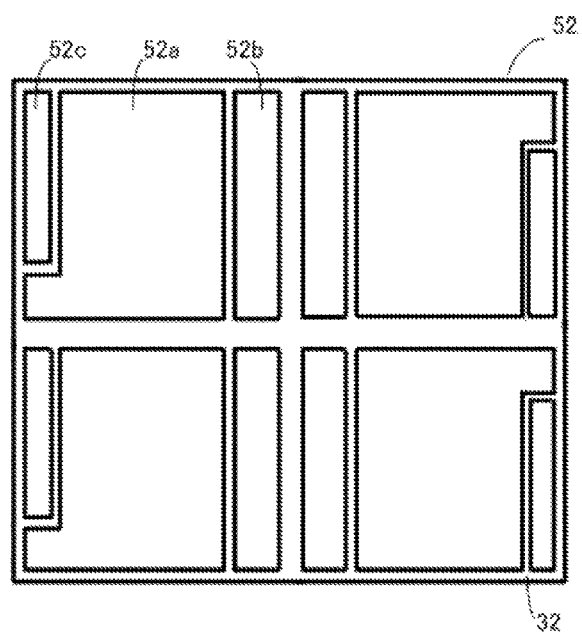

FIG. 20(a) describes the current paths in the three-level inverter shown in FIG. 18 made to operate with power supply 41;

FIG. 20(b) describes the current paths in the three-level inverter shown in FIG. 18 made to operate with power supply 42;

FIG. 21 describes the current paths in the three-level inverter shown in FIG. 18 made to operate with power supplies 41 and 42;

FIG. 22(a) is a top plan view of an insulated substrate according to a first modified example;

FIG. 22(b) is a top plan view of an insulated substrate according to a second modified example; and FIG. 22(c) is a top plan view of an insulated substrate according to a third modified example.

DETAILED DESCRIPTION

Embodiments of the invention will be described in detail hereinafter with reference to the accompanied drawings which illustrate embodiments of the invention.

[First Embodiment]

FIG. 1(a) is the top plan view of a power semiconductor module according to a first embodiment of the invention. FIG. 1(b) is the side plan view of the power semiconductor module according to the first embodiment. In FIG. 1(b), insulated-gate bipolar transistor chips (hereinafter referred to as "IGBT chips") and freewheel diode chips (hereinafter referred to as "FWD chips") are not shown for the convenience of descriptions.

Figure 2:
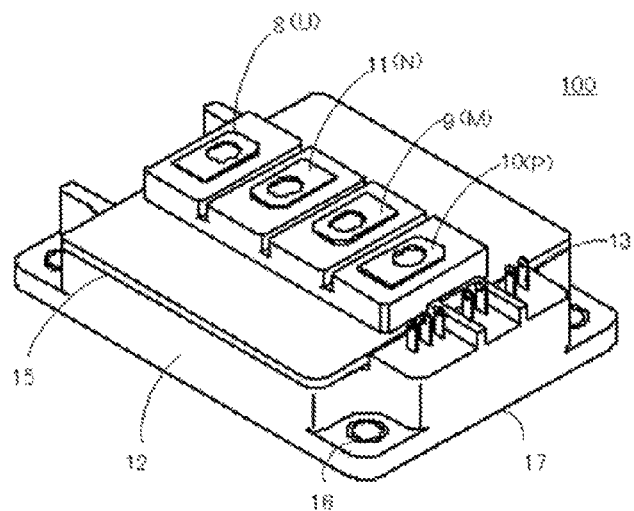
FIG. 2 is the isometric view of the power semiconductor module according to the first embodiment showing the external appearance thereof.

FIG. 2 is the isometric view of the power semiconductor module according to the first embodiment showing the external appearance thereof.

Figure 3:
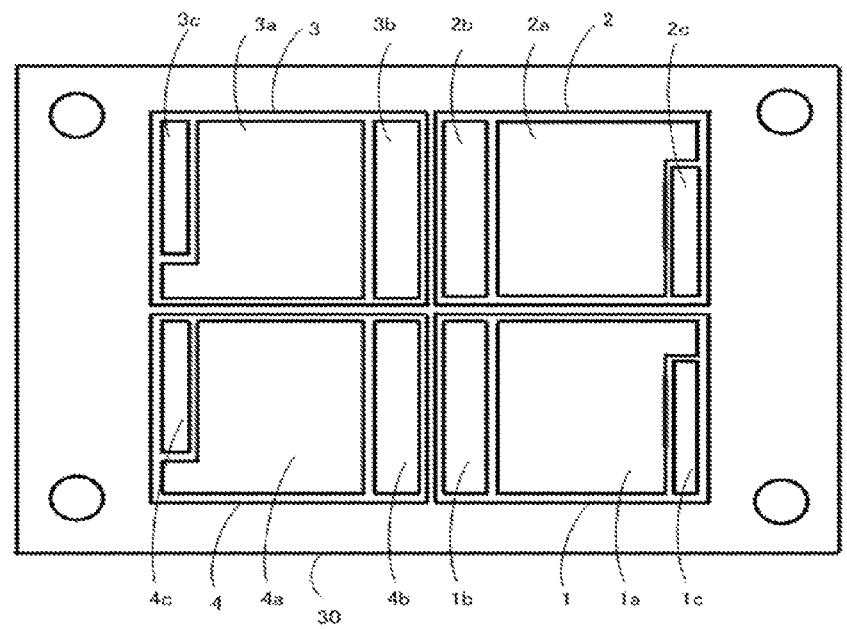
FIG. 3 is a top plan view showing a radiator plate and insulated substrates, each including an electrical-conductor pattern formed thereon.

FIG. 3 is a top plan view showing a radiator plate and insulated substrates, each including an electrical-conductor pattern formed thereon.

Figure 4:
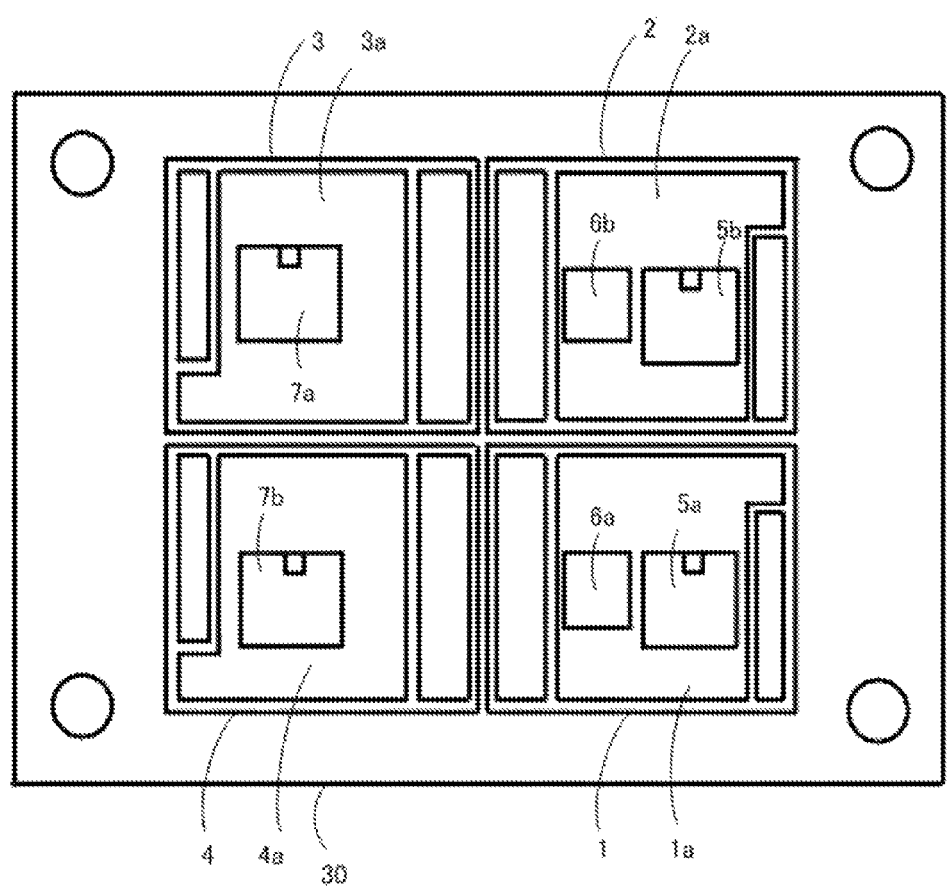
FIG. 4 is a top plan view showing chips fixed to the electrical-conductor patterns.
Figure 5:
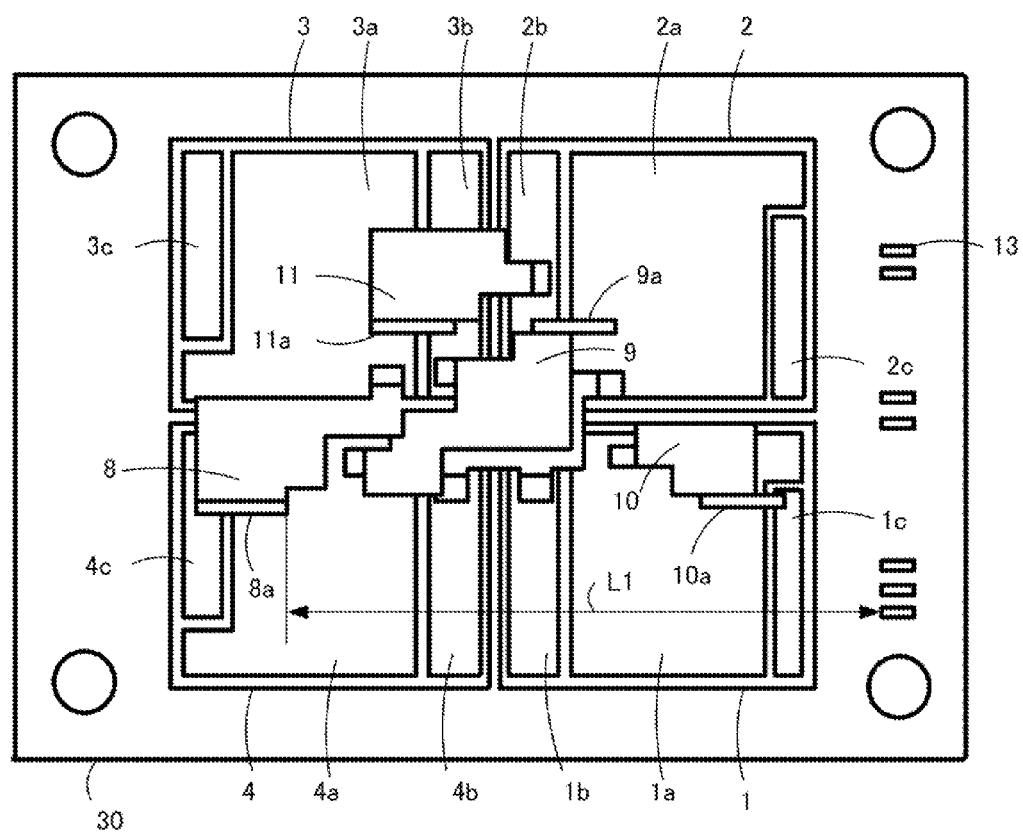
FIG. 5 is a top plan view showing terminals fixed to the electrical-conductor patterns.
Figure 6:
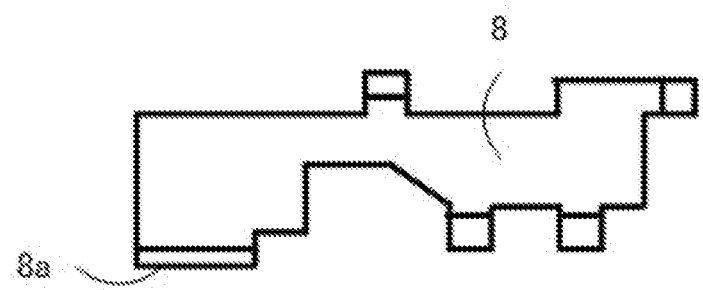
FIG. 6(a) is the top plan view of a U-terminal.
FIG. 6(b) is the side plan view of the U-terminal.
FIG. 6(c) is the top plan view of an M-terminal.
FIG. 6(d) is the side plan view of the M-terminal.
Figure 6:
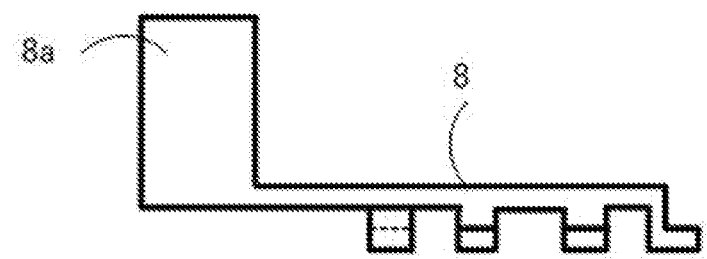
Figure 6:
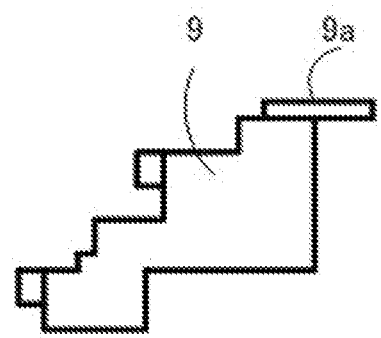
Figure 6:
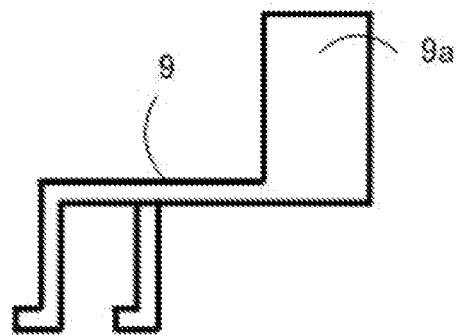

FIG. 4 is a top plan view showing chips fixed to the electrical-conductor patterns. FIG. 5 is a top plan view showing terminals fixed to the electrical-conductor patterns. FIG. 6(a) is the top plan view of a U-terminal. FIG. 6(b) is the side plan view of the U-terminal. FIG. 6(c) is the top plan view of an M-terminal. FIG. 6(d) is the side plan view of the M-terminal.

Figure 7:
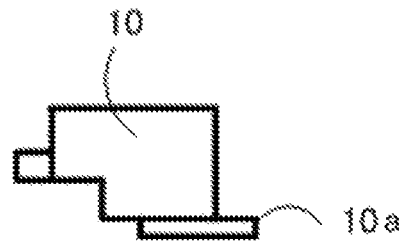
FIG. 7(a) is the top plan view of a P-terminal.
FIG. 7(b) is the side plan view of the P-terminal.
FIG. 7(c) is the top plan view of an N-terminal.
FIG. 7(d) is the side plan view of the N-terminal.
Figure 7:
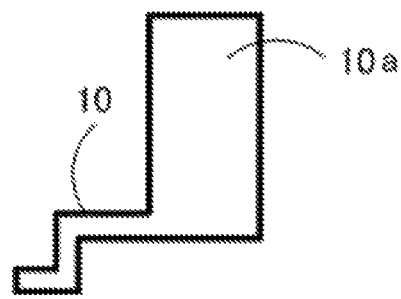
Figure 7:
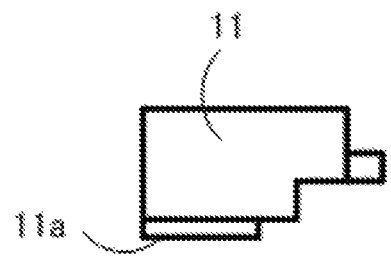
Figure 7:
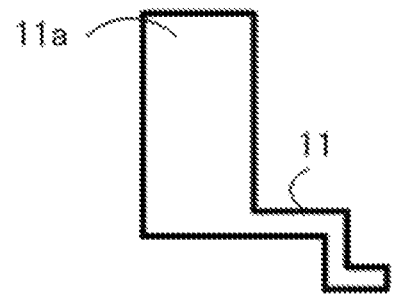

FIG. 7(a) is the top plan view of a P-terminal. FIG. 7(b) is the side plan view of the P-terminal. FIG. 7(c) is the top plan view of an N-terminal. FIG. 7(d) is the side plan view of the N-terminal.

Figure 8:
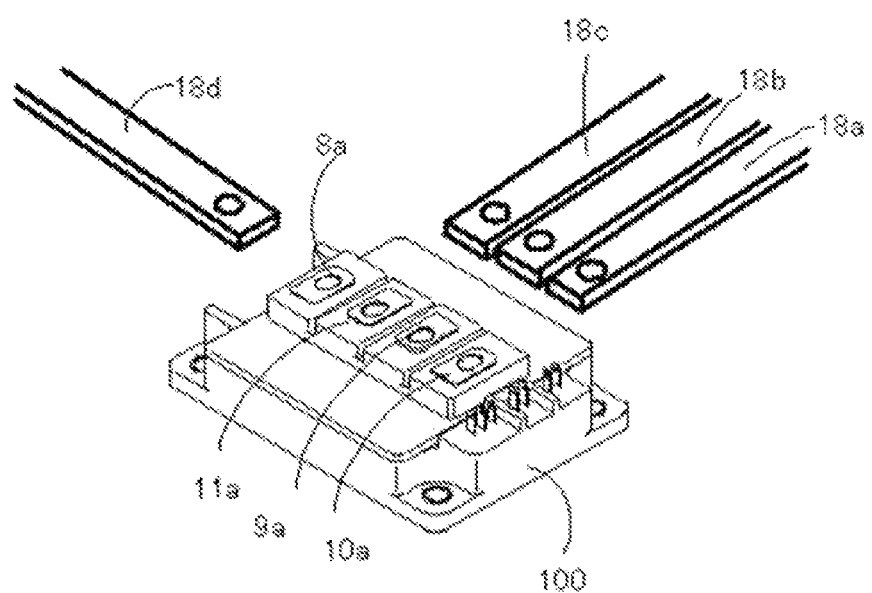
FIG. 8 is the isometric view of the power semiconductor module describing the connection of external connection bars thereto.

FIG. 8 is the isometric view of the power semiconductor module describing the connection of external connection bars thereto.

Power semiconductor module 100 according to the first embodiment of the invention houses a three-level inverter circuit therein. Now the structure of power semiconductor module 100 will be described below.

Figure 1:
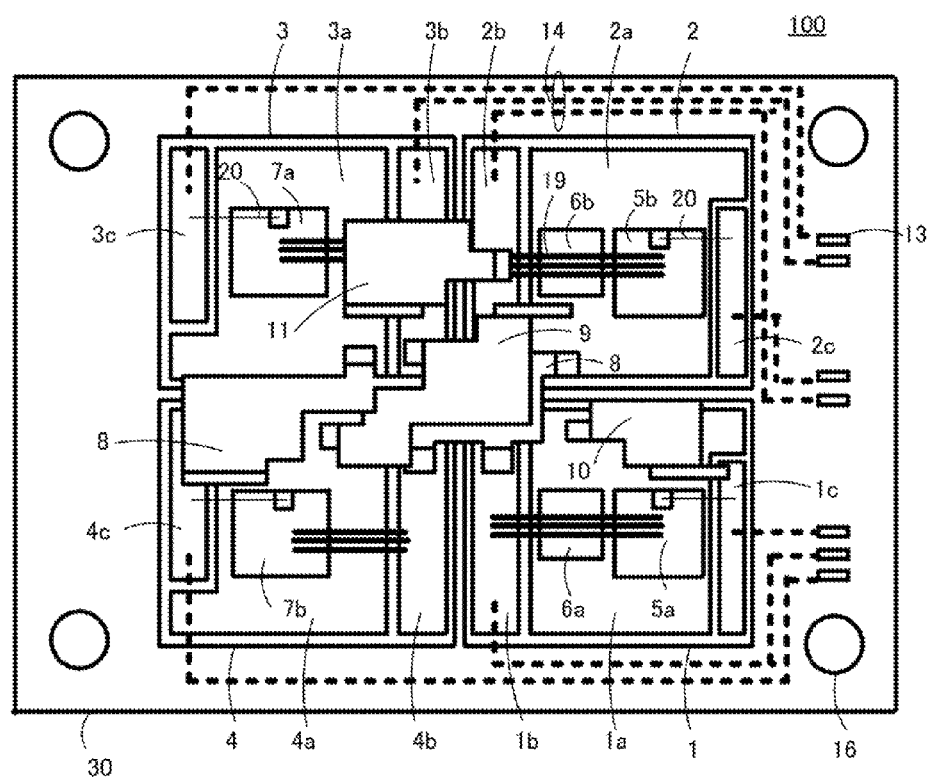
FIG. 1(a) is the top plan view of a power semiconductor module according to a first embodiment of the invention.
FIG. 1(b) is the side plan view of the power semiconductor module according to the first embodiment.
Figure 1:
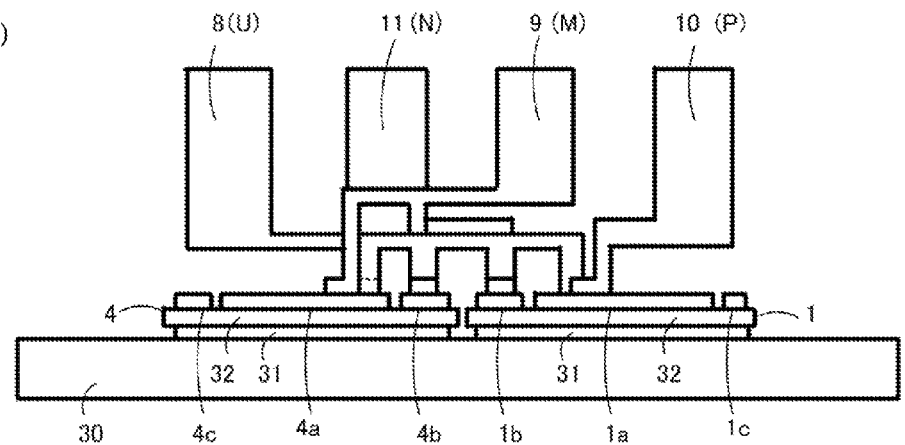

As shown in FIGS. 1(a) through 2, power semiconductor module 100 includes radiator plate 30; insulated substrates 1 through 4, each including an electrical-conductor pattern formed thereon, insulated substrates 1 through 4 being arranged like tiles on radiator plate 30 and fixed to radiator plate 30; IGBT chips 5a, 5b, 7a, and 7b fixed onto insulated substrates 1 through 4; and U-, M-, P-, and N-terminals 8, 9, 10, and 11 connected electrically to insulated substrate 1 through 4. Power semiconductor module 100 includes also case 17 shaped nearly with a rectangular parallelepiped and fixed to radiator plate 30 such that the insulated substrates are housed therein; connector end sections 8a, 9a, 10a, and 11a of U-, M-, P-, and N-terminals 8, 9, 10, and 11 arranged on one major surface of case 17; and control terminals 13 aligned on one side wall of case 17 (cf., FIG. 8).

As shown in FIGS. 1(a) and 1(b), four rectangular insulated substrate 1, 2, 3, and 4, each including an electrical-conductor pattern formed thereon, are arranged on radiator plate 30, called, for example, a "copper base". On each rectangular insulated substrate 1, 2, 3, or 4, the same electrical-conductor pattern is formed. For example, insulated substrate 1 includes ceramic substrate 32, back-surface electrical-conductor layer 31 formed on the back surface of ceramic substrate 32, and an electrical-conductor pattern on the front surface of ceramic substrate 32.

The electrical-conductor pattern includes first electrical-conductor layer 1a, second electrical-conductor layer 1b, and third electrical-conductor layer 1c. In the same manner as described above, insulated substrate 2, 3, or 4 includes ceramic substrate 32, back-surface electrical-conductor layer 31 formed on the back surface of ceramic substrate 32, first electrical-conductor layer 2a, 3a or 4a, second electrical-conductor layer 2b, 3b or 4b, and third electrical-conductor layer 2c, 3c, or 4c. By using the same baseboard by different ways, the manufacturing costs of the power semiconductor module are reduced.

Four insulated substrates 1, 2, 3, and 4 are arranged anticlockwise as shown in FIG. 1(a). IGBT chip 5a and FWD chip 6a are fixed to first electrical-conductor layer 1a on insulated substrate 1. IGBT chip 5b and FWD chip 6b are fixed to first electrical-conductor layer 2a on insulated substrate 2. Reverse blocking IGBT chip 7a is fixed to first electrical-conductor layer 3a on insulated substrate 3. Reverse blocking IGBT chip 7b is fixed to first electrical-conductor layer 4a on insulated substrate 4.

According to the first embodiment, first electrical-conductor layers 1a, 2a, to which IGBT chips 5a, 5b and FWD chips 6a, 6b constituting the arms are fixed, are arranged on the right side of radiator plate 30 as one faces it. First electrical-conductor layers 3a and 4a, to which reverse blocking IGBT chips 7a and 7b which are intermediate devices are fixed, are arranged on the left side of radiator plate 30 as one faces it. To first electrical-conductor layers 1a, 2a, 3a, and 4a, the collectors of IGBT chips 5a and 5b, the cathodes of FWD chips 6a and 6b, and the collectors of reverse blocking IGBT chips 7a and 7b are fixed.

To second electrical-conductor layers 1b, 2b, 3b, and 4b, the IGBT chip 5a emitter and the FWD chip 6a anode, the IGBT chip 5b emitter and the FWD chip 6b anode, the reverse blocking IGBT chip 7a emitter, and the reverse blocking IGBT chip 7b emitter are connected with wires 19, respectively. To third electrical-conductor layers 1c, 2c, 3c, and 4c, the IGBT chip 5a gate, the IGBT chip 5b gate, the reverse blocking IGBT chip 7a gate, and the reverse blocking IGBT chip 7b gate are connected with wires 20, respectively.

U-terminal 8 that works as an output terminal of the inverter circuit is connected to second electrical-conductor layers 1b and 4b, and first electrical-conductor layers 2a and 3a. M-terminal 9 that works as an intermediate terminal of the inverter circuit is connected to first electrical-conductor layer 4a and second electrical-conductor layer 3b. P-terminal 10 is connected to first electrical-conductor layer 1a. N-terminal 11 is connected to second electrical-conductor layer 2b.

In power semiconductor module 100, IGBT chip 5a and FWD chip 6a are connected in opposite parallel to each other to form an upper arm (first circuit). IGBT chip 5b and FWD chip 6b are connected in opposite parallel to each other to form a lower arm (second circuit). Reverse blocking IGBT chips 7a and 7b are connected in opposite parallel to each other to form an intermediate circuit.

The IGBT chips, the FWD chips and the terminals are fixed or connected to the electrical-conductor patterns by the methods well known to the persons skilled in the art such as the method that employs a solder and the direct bonding method.

As shown in FIG. 2, case 17 is arranged around insulated substrates 1, 2, 3, and 4. Case 17 includes frame 12 and cover 15. Control terminals 13 protrude from the upper surface of case 17 along one side wall of frame 12. Control terminals 13 are connected to third electrical-conductor layers 1c, 2c, 3c, and 4c in case 17 via gate wiring conductors 14 (including an auxiliary emitter wiring conductor) arranged along frame 12. From the upper surface of cover 15 stuck onto frame 12, the end sections of U-, M-, P-, and N-terminals 8, 9, 10, and 11 are exposed.

The end sections of U-, M-, P-, and N-terminals 8, 9, 10, and 11 shown in FIG. 1(b) are inserted through the holes (not shown) of cover 15, bent at the right angles, and fixed to the upper surface of cover 15 as shown in FIG. 2. The end sections of U-, M-, P-, and N-terminals 8, 9, 10, and 11 bent at the right angles as shown in FIG. 2 work as connector end sections 8a, 9a, 10a, and 11a for connecting U-, M-, P-, and N-terminals 8, 9, 10, and 11 to the external power supplies and the load (cf. FIG. 8).

Mounting holes 16 are bored through frame 12 and filled with a gel not shown. A not-shown beam is fixed to frame 12. The beam fixes the positions of U-, M-, P-, and N-terminals 8, 9, 10, and 11. Control terminals 13 and gate wiring conductors 14 are fixed to frame 12.

Although the output terminal is described as U-terminal 8 above, the output terminal may be the U-terminal, the V-terminal, or the W-terminal in the case of a three-phase inverter. P-terminal 10 is biased at the positive electrode potential, N-terminal 11 at the negative electrode potential, and M-terminal 9 at the neutral point potential. U-terminal 8 is based at the U-phase potential, the not-shown V-terminal at the V-phase potential, and the not-shown W-terminal at the W-phase potential.

Now the main structure of power semiconductor module 100 will be described below in connection with the manufacturing steps thereof.

Referring now to FIG. 3, radiator plate 30 is prepared. Four insulated substrates 1, 2, 3, and 4 are fixed onto radiator plate 30 with a not-shown solder. The electrical-conductor patterns on insulated substrates 1, 2, 3, and 4 are made of a copper foil. As one looks downward, first electrical-conductor layer 1a is shaped with a letter L, second electrical-conductor layer 1b with a letter I, and third electrical-conductor layer 1c with a letter I. First electrical-conductor layers 2a through 4a, second electrical-conductor layers 2b through 4b, and third electrical-conductor layers 2c through 4c are shaped in the same manner as described above in connection with the first through third electrical-conductor layers 1a, 1b and 1c. The electrical-conductor patterns are arranged in the same manner. For example, second electrical-conductor layer 1b is formed along one side of ceramic substrate 32. Insulated substrates 1, 2, 3, and 4 are arranged such that second electrical-conductor layers 1b, 2b, 3b and 4b are facing to each other.

Referring now to FIG. 4, IGBT chip 5a and FWD chip 6a are fixed to first electrical-conductor layer 1a on insulated substrate 1 with a solder. IGBT chip 5b and FWD chip 6b are fixed to first electrical-conductor layer 2a on insulated substrate 2 with a solder. Reverse blocking IGBT chip 7a is fixed to first electrical-conductor layer 3a on insulated substrate 3 with a solder. Reverse blocking IGBT chip 7b is fixed to first electrical-conductor layer 4a on insulated substrate 4 with a solder. The fixings may be conducted simultaneously with fixing insulated substrates 1 through 4 to radiator plate 30.

Referring now to FIG. 5, the terminals are fixed to the respective electrical-conductor patterns with a solder. In detail, P-terminal 10 is fixed, to first electrical-conductor layer 1a, M-terminal 9 to first electrical-conductor layer 4a and second electrical-conductor layer 3b, N-terminal 11 to second electrical-conductor layer 2b, U-terminal 8 to first electrical-conductor layers 2a, 3a and second electrical-conductor layers 1b, 4b, respectively, with a solder. The fixings may be conducted simultaneously with the fixing of insulated substrates 1 through 4 and the fixing of IGBT chips 5a, 5b, 7a, and 7b. The fixings may be conducted with a solder, by direct bonding or by ultrasonic bonding.

Connector end sections 10a, 9a, 11a, and 8a exposed from cover 15 of case 17 for connecting P-, M-, N-, and U-terminals 10, 9, 11, and 8 to the outside are arranged in the order of the above description from the side of control electrodes 13.

Referring now to FIGS. 6(a) and 6(b), U-terminal 8 includes a plate-shaped main body section, connector end section 8a extending in perpendicular to the main body section, and four leg sections. When the leg sections are fixed to first electrical-conductor layers 2a, 3a and second electrical-conductor layers 1b, 4b as shown in FIG. 5, the main body section of U-terminal 8 is arranged almost in parallel to the planes of insulated substrates 1 through 4 and connector end section 8a is extended almost in perpendicular to insulated substrates 1 through 4.

Referring now to FIGS. 6(c) and 6(d), M-terminal 9 includes a plate-shaped main body section, connector end section 9a extending almost in perpendicular to the main body section, and two leg sections. When the leg sections of M-terminal 9 are fixed to first electrical-conductor layer 4a and second electrical-conductor layer 3b as shown in FIG. 5, the main body section of M-terminal 9 is arranged almost in parallel to the planes of insulated substrates 1 through 4 and connector end section 9a is extended almost in perpendicular to insulated substrates 1 through 4.

Referring now to FIGS. 7(a) and 7(b), P-terminal 10 includes a plate-shaped main body section, connector end section 10a extending almost in perpendicular to the main body section, and a leg section. The leg section is fixed to first electrical-conductor layer 1 a as shown in FIG. 5.

Referring now to FIGS. 7(c) and 7(d), N-terminal 11 includes a plate-shaped main body section, connector end section 11a extending almost in perpendicular to the main body section, and a leg section. The leg section is fixed to second electrical-conductor layer 2b as shown in FIG. 5.

As described above, U- and M-terminals 8 and 9 are arranged such that the main body sections thereof are overlapping in parallel to each other with a certain space left therebetween. Connector end sections 8a, 9a, 10a, and 11a are arranged such that connector end sections 8a, 9a, 10a, and 11a are exposed outside case 17 through the holes formed in cover 15, when case 17 is fixed to radiator plate 30.

The terminals are formed by stamping and bending a copper plate. Alternatively, the main body section, the connector end section, and the leg section may be manufactured separately and combined into a unit. Although not illustrated in FIGS. 6(a) through 7(d), a screw hole may be formed in connector end sections 8a, 9a, 10a, and 11a (cf., FIG. 8).

By arranging M-terminal 9 above U-terminal 8 in case 17 such that M-terminal 9 is overlapping U-terminal 8, the main current includes opposite direction components in M- and U-terminals 9 and 8, and the mutual inductance between U-terminal 8 and M-terminal 9, which are liable to cause electromagnetic noises vigorously, is reduced. Therefore, the electromagnetic noises are reduced. Insulated substrates 3 and 4, to which reverse blocking IGBT's 7a and 7b are fixed, are arranged side by side along the inner side wall of case 17 facing opposite to the case 17 side wall, from which control electrodes 13 are protruding. By the arrangement, M-terminal 9 is arranged such that M-terminal 9 is crossing over U-terminal 8 and an area, in which terminals 8 and 9 overlap each other with a certain space left therebetween, is secured.

Connector end sections 8a through 11a exposed from cover 15 are aligned in the order of connector end section 10a for P-terminal 10, connector end section 9a for M-terminal 9, connector end section 11a for N-terminal 11, and connector end section 8a for U-terminal 8 from the side of control electrodes 13. As shown in FIG. 1(a), connector end sections 8a through 11a are facing to the same direction. Alternatively, connector end sections 8a through 11a may be facing to the different directions with no problem, as far as connector end sections 8a through 11a are aligning from the side of control electrodes 13, when connector end sections 8a through 11a are bent on cover 15. Still alternatively, terminals 8a through 11a may be protruding from cover 15 without being bent.

As shown in FIG. 8, exposed connector end sections 10a, 9a, and 11a are connected to external connection bars 18a, 18b, and 18c, respectively. If connector end sections 10a, 9a, and 11a are aligned in the order of the above description, it will be easy to attach external connection bars 18a, 18b, and 18c to connector end sections 10a, 9a, and 11a. Exposed connector end section 8a of U-terminal 8 is connected to a load via external connection bar 18d. The distance L1 between exposed connector end section 8a of U-terminal 8 and control terminals 13 is set to be longer than the distances between exposed connector end sections 10a, 9a, and 11a of N-, M-, and P-terminals 10, 9, and 11 and control terminals 13. By the setting, the noises radiated from U-terminal 8 and introduced into control terminals 13 are reduced.

Figure 9:
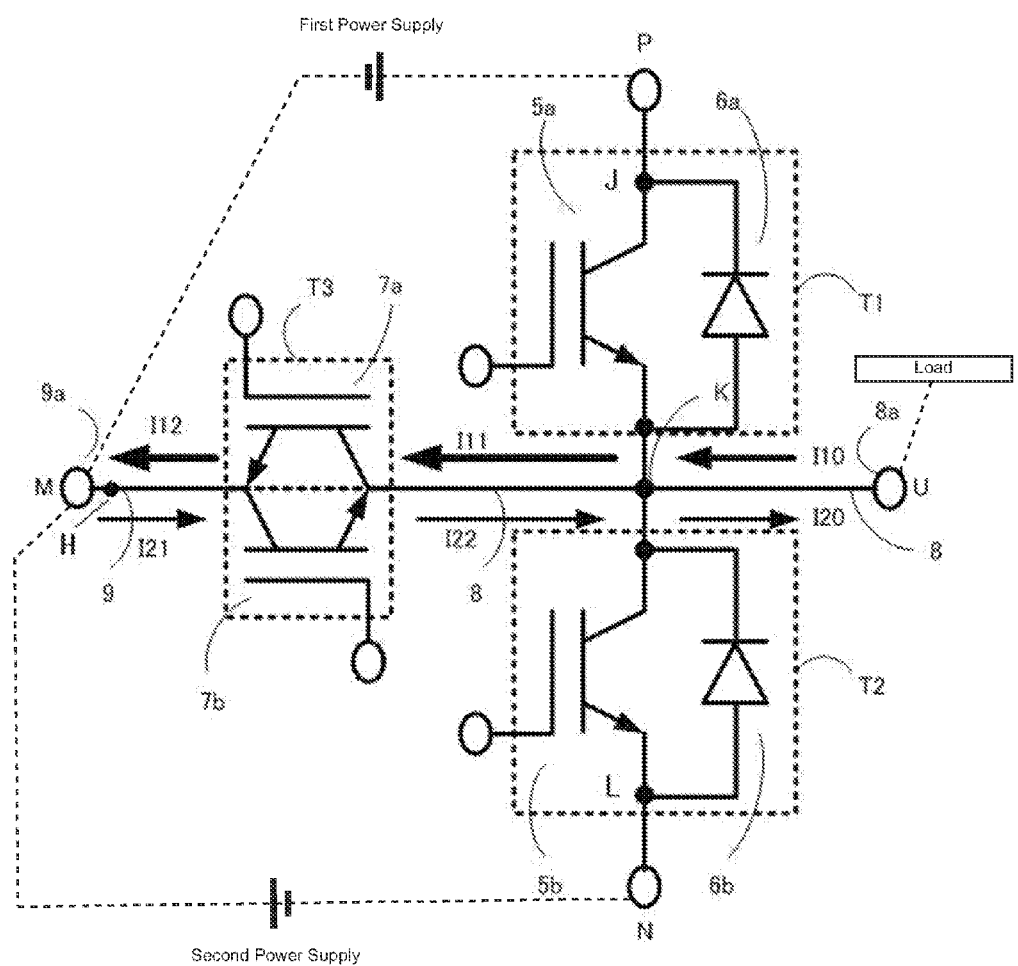
FIG. 9 is the equivalent circuit diagram for one-phase of the three-level inverter.

Now the circuit which constitutes power semiconductor module 100 will be described in detail below. FIG. 9 is the equivalent circuit diagram for one-phase of the three-level inverter.

In FIG. 9, upper arm circuit (first circuit) T1, lower arm circuit (second circuit T2, and intermediate circuit T3 are described. Upper arm circuit T1 includes IGBT chip 5a and FWD chip 6a. Lower arm circuit T2 includes IGBT chip 5b and FWD chip 6b. Intermediate circuit T3 includes reverse blocking IGBT's 7a and 7b connected in opposite parallel to each other.

In FIG. 9, a first connection point H, a second connection point J, a third connection point K, and a fourth connection point L are described. At the first connection point H, first and second power supplies can be connected. At the second connection point J, the high-potential side of the first power supply and the first circuit that constitute upper arm T1 are connected. At the third connection point K, the other end of the first circuit, the second circuit that constitutes lower arm T2, intermediate circuit T3 are connected, and a load can be connected. At the fourth connection point L, the low-potential-side of the second power supply and the second circuit are connected.

The third connection point K, the first reverse blocking IGBT 7a collector, and the second reverse blocking IGBT 7b emitter are connected at output terminal 8 shown in FIGS. 1(a) and 1(b). The first connection point H, the first reverse blocking IGBT 7a emitter, and the second reverse blocking IGBT 7b collector are connected at intermediate terminal 9.

In the steady-state operation, current I10 flows from a not-shown load into exposed connector end section 8a of U-terminal 8, for example. Current I10 becomes current I11, the magnitude of which is the same with the magnitude of current I10, via the connection point K of upper and lower arm circuits T1 and T2 and flows to the collector of reverse blocking IGBT chip 7a, that is an intermediate device in intermediate circuit T3. Current I11 becomes current I12, the magnitude of which is the same with the magnitude of current I11, and flows from the emitter of reverse blocking IGBT chip 7a, in intermediate circuit T3, into M-terminal 9. Current I12 flows via exposed connector end section 9a of M-terminal 9 to the low-potential-side of the not-shown first power supply of the three-level inverter.

In the regenerating operation, current I21 flows from the low-potential-side of the not-shown first power supply to the collector of reverse blocking IGBT chip 7b in intermediate circuit T3 via exposed connector end section 9a of M-terminal 9. From the emitter of reverse blocking IGBT chip 7b in intermediate circuit T3, current I22, the magnitude of which is the same with the magnitude of current I21, flows to the third connection point K. From the third connection point K, current I20, the magnitude of which is the same with the magnitude of current I22, flows into the load side. Current I20 flows to the high-potential side of the first power supply of the three-phase inverter via the FWD chips for the other phases.

As described above, the current that flows through U-terminal 8 in the steady-state operation is the current that flows via the load but not the current that flows via upper and lower arm circuits T1 and T2.

Figure 10:
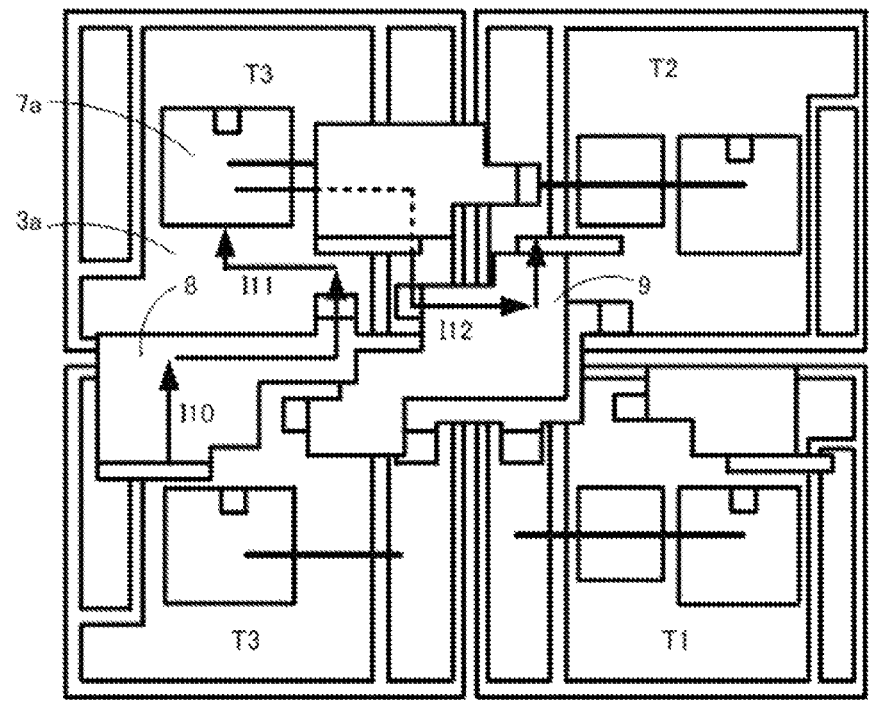
FIG. 10(a) is the top plan view of the power semiconductor module describing the current that flows from the U-terminal to the M-terminal.
FIG. 10(b) is the top plan view of the power semiconductor module describing the current that flows from the M-terminal to the U-terminal.
Figure 10:
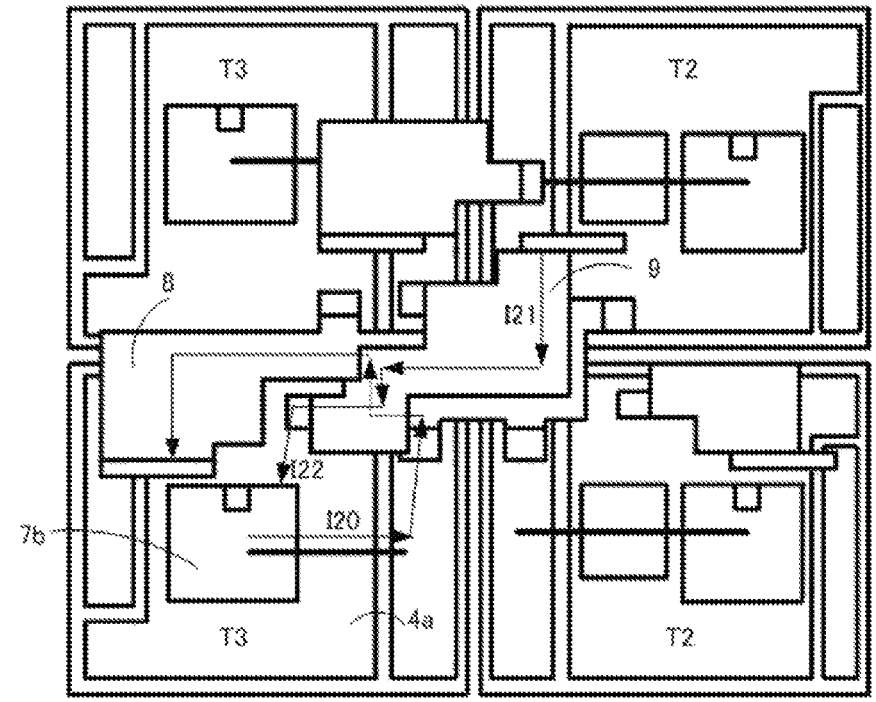

Now the currents which flow in power semiconductor module 100 will be described below. FIG. 10(*a*) is the top plan view of the power semiconductor module describing the current that flows from the U-terminal to the M-terminal. FIG. 10(*b*) is the top plan view of the power semiconductor module describing the current that flows from the M-terminal to the U-terminal.

As described in FIG. 10(*a*), current I10 flows from U-terminal 8 to electrical-conductor layer 3a. Current I10 becomes current I11, which flows into the collector of reverse blocking IGBT chip 7a in intermediate circuit T3. Current I11 becomes current I12, which flows from the emitter of reverse blocking IGBT chip 7a to M-terminal 9. Since U-terminal 8, through which current I10 flows, and M-terminal 9, through which current I12 flows, include the portions thereof overlapping each other in close proximity, the mutual inductance is small.

As described in FIG. 10(*b*), current I21 flows from M-terminal 9 to electrical-conductor layer 4a. Current I21 becomes current I22, which flows into the collector of reverse blocking IGBT chip 7b in intermediate circuit T3. Current I22 becomes current I20, which flows from the emitter of reverse blocking IGBT chip 7b to U-terminal 8. M-terminal 9, through which current I21 flows, and U-terminal 8, through which current I20 flows, include the portions thereof overlapping each other in close proximity (in the vertical direction in the plane of paper in FIG. 10(*b*)). Since currents I20 and I21 have some components which flow vertically but in the opposite directions (in the plane of paper) in the overlapping portions of M- and U-terminals 9 and 8, the mutual inductance is somewhat small.

Figure 11:
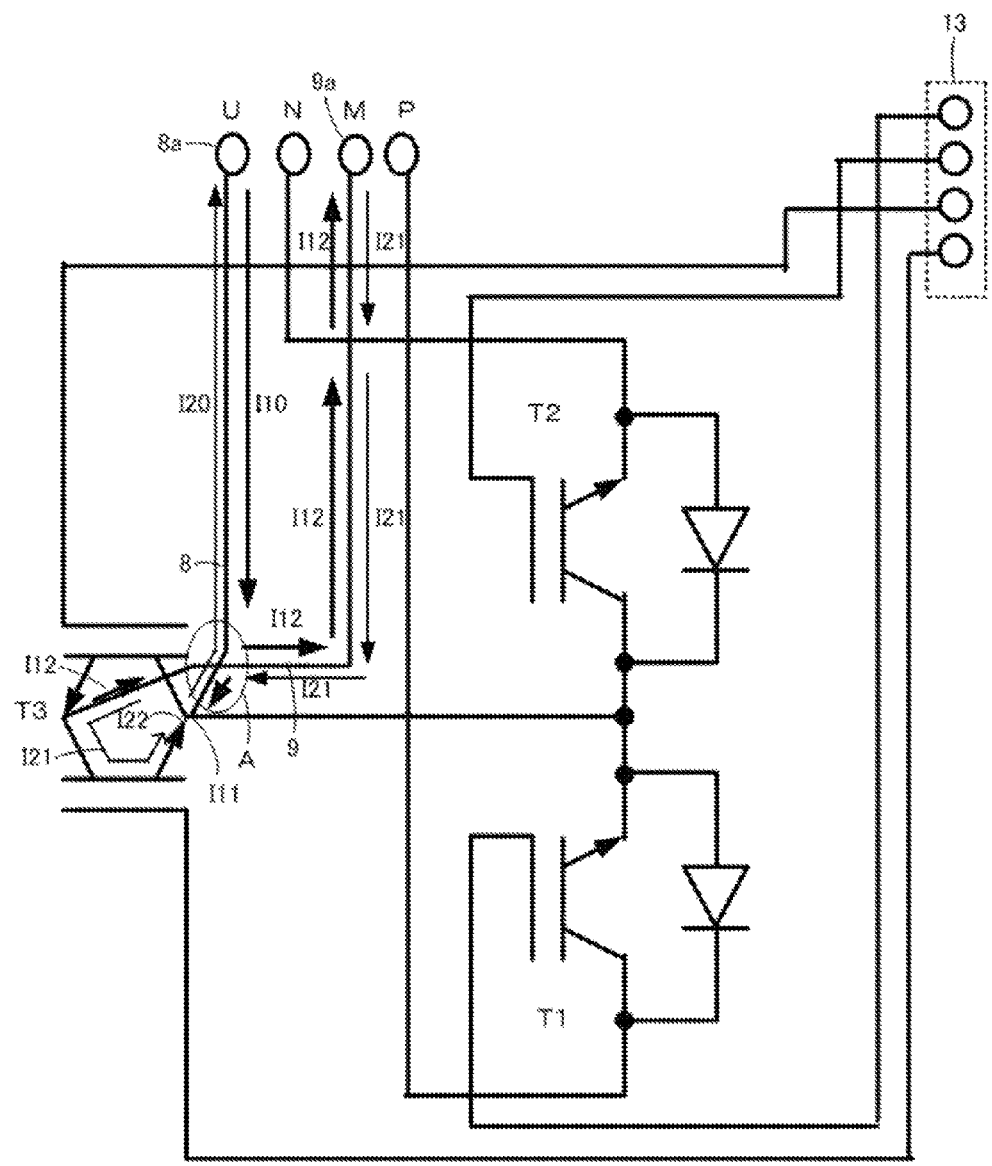
FIG. 11 is an equivalent circuit diagram that considers the chip arrangement in FIG. 1(a)

FIG. 11 is an equivalent circuit diagram that considers the chip arrangement in FIG. 1(*a*). Since U- and M-terminals 8 and 9 cross each other and overlap each other in the section A, the mutual inductance is small.

Figure 12:
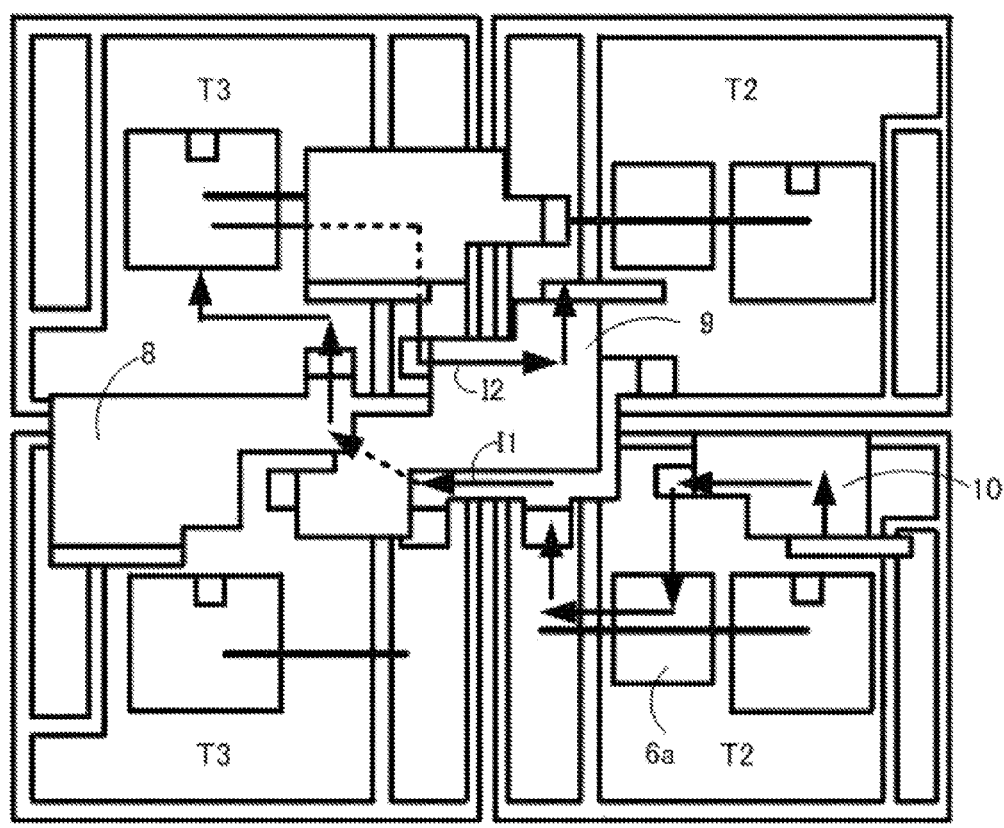
FIG. 12 is the top plan view of the power semiconductor module describing the current paths in the transient period, in which the operation shifts from the regenerating mode to the power feed to the load mode.

FIG. 12 is the top plan view of the power semiconductor module describing the current paths in the transient period, in which the operation shifts from the regenerating mode to the power feed to the load mode.

In the transient period, a reverse recovery current flows through FWD chip 6a which is conductive. Reverse recovery current I1 becomes current I2 via intermediate circuit T3 and current I2 flows to M-terminal 9. In this case, a current path from the arm (here P-terminal 10) to M-terminal 9 is formed as shown in FIG. 12. Therefore, the direction of current I1 that flows from P-terminal 10 to intermediate circuit T3 and the direction of current I2 that flows from intermediate circuit T3 to M-terminal 9 are opposite to each other. Therefore, the mutual inductance during the transient period is smaller than the mutual inductance during the normal mode of operation. Since the overshoot voltage applied between the collectors and emitters of IGBT chips 5a, 5b, 7a, and 7b is made to be small by the reverse recovery current and the circuit inductance, it is possible to reduce the size of snubber capacitors 21 which protect IGBT chips 5a, 5b, 7a, and 7b.

Figure 13:
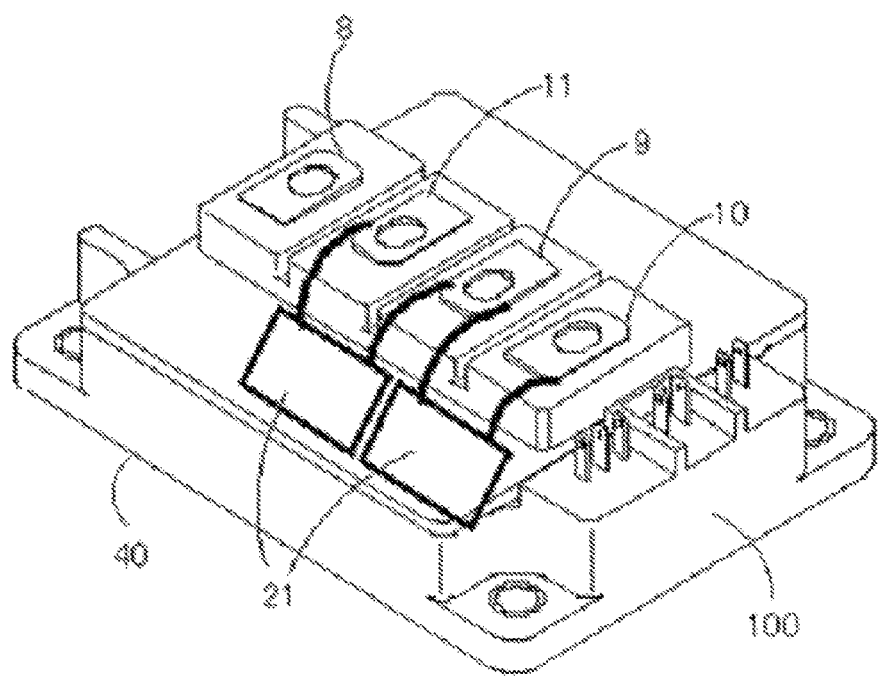
FIG. 13 is the isometric view of the power semiconductor module, to which snubber circuits are connected.

FIG. 13 is the isometric view of power semiconductor module 100, to which snubber circuits are connected.

The snubber circuit is snubber capacitor 21. Snubber capacitors 21 are connected between P- and M-terminals 10 and 9 and between M- and N-terminals 9 and 11.

Since the mutual inductance in case 17 is small according to the invention, it is possible to reduce the size of snubber capacitor 21.

Although the power semiconductor module according to the first embodiment has been described in connection with insulated substrates 1, 2, 3, and 4 fixed to radiator plate 30, the other types of insulated substrates may be employed with no problem. For example, two insulated substrates 50 or 51 shown in FIG. 22(*a*) or FIG. 22(*b*) may be arranged on and fixed to radiator plate 30 with no problem. In insulated substrate 50, ceramic substrates 32 of insulated substrates 1 and 2 are combined into a unit. In insulated substrate 51, ceramic substrates 32 of insulated substrates 1 and 4 are combined into a unit. Since the component parts are used commonly by using the insulated substrates as described above, the manufacturing costs of the power semiconductor modules are reduced. The same effects are obtained by the insulated substrate shown in FIG. 22(*c*) that combines four insulated substrates 1, 2, 3, and 4 into a unit and arranges the electrical-conductor layers in the same manner as shown in FIG. 1(*a*).

By employing three power semiconductor modules 100, a three-phase three-level inverter as shown in FIG. 18, the output terminals thereof are U-, V-, and W-terminals, is configured. By employing two power semiconductor modules 100, a single-phase three-level inverter, the output terminals thereof are U- and V- terminals, is configured.

[Second Embodiment]

Figure 14:
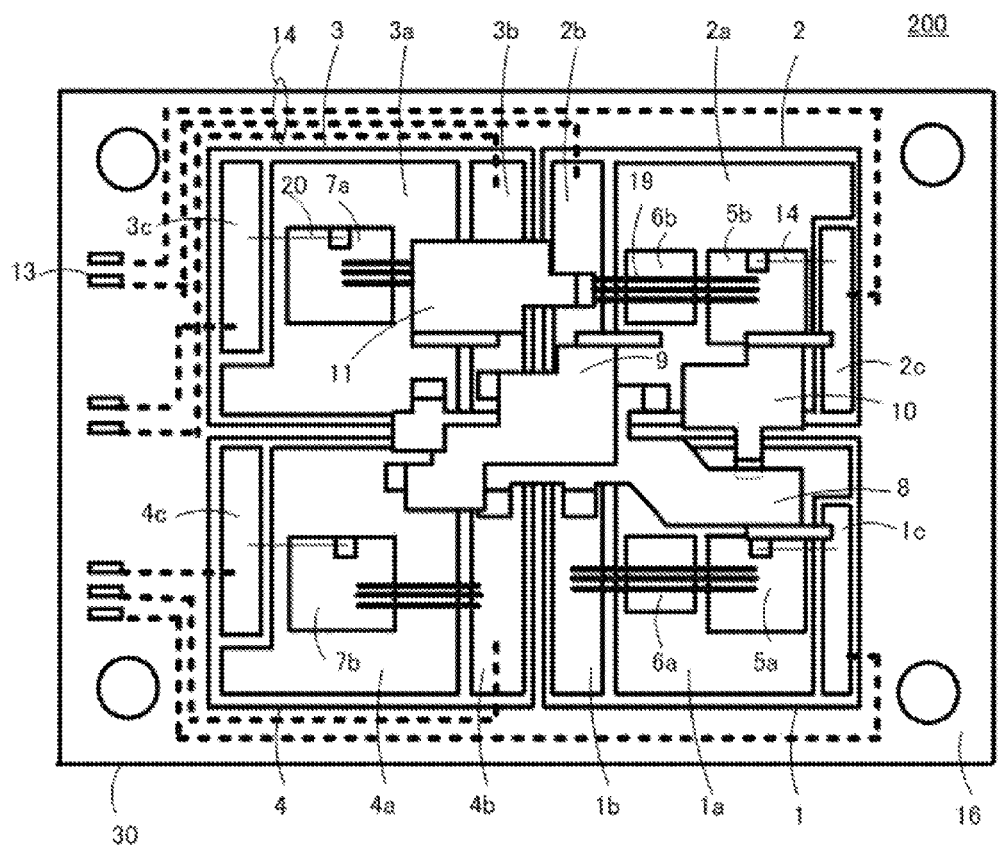
FIG. 14(a) is the top plan view of a power semiconductor module according to a second embodiment of the invention.
FIG. 14(b) is the side plan view of the power semiconductor module according to the second embodiment.
Figure 14:
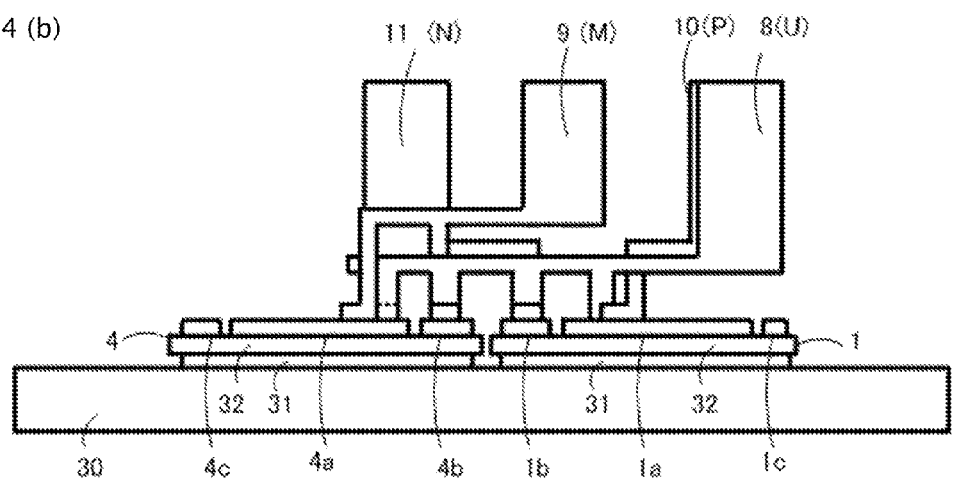
Figure 15:
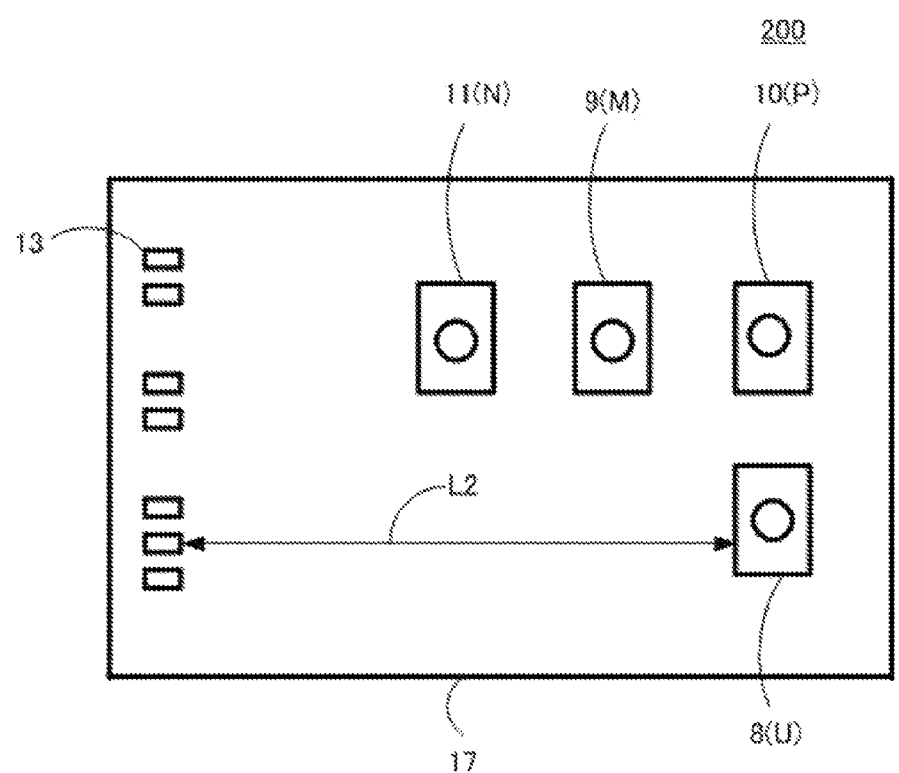
FIG. 15 is the top plan view of a case showing the terminal arrangement thereon.
Figure 16:
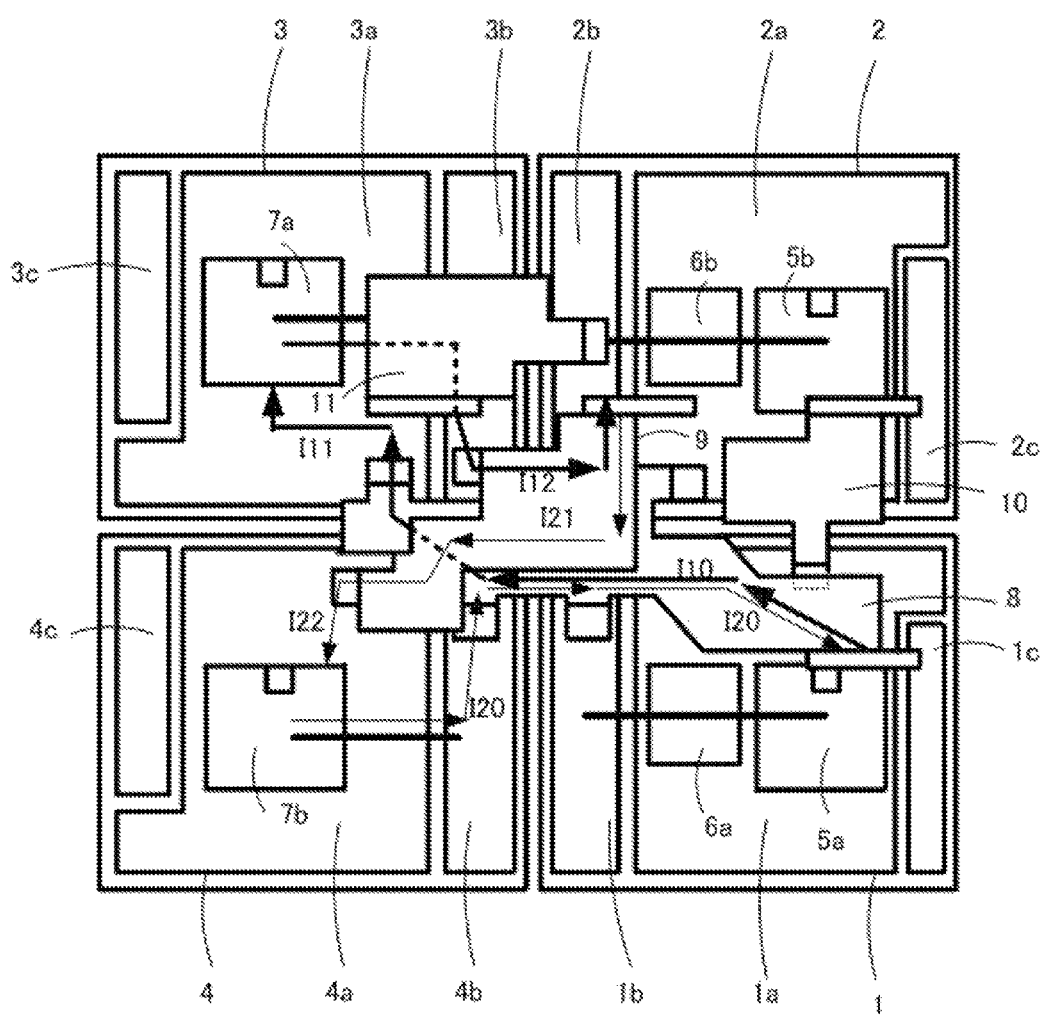
FIG. 16 is the top plan view of the power semiconductor module according to the second embodiment describing the current paths therein.
Figure 17:
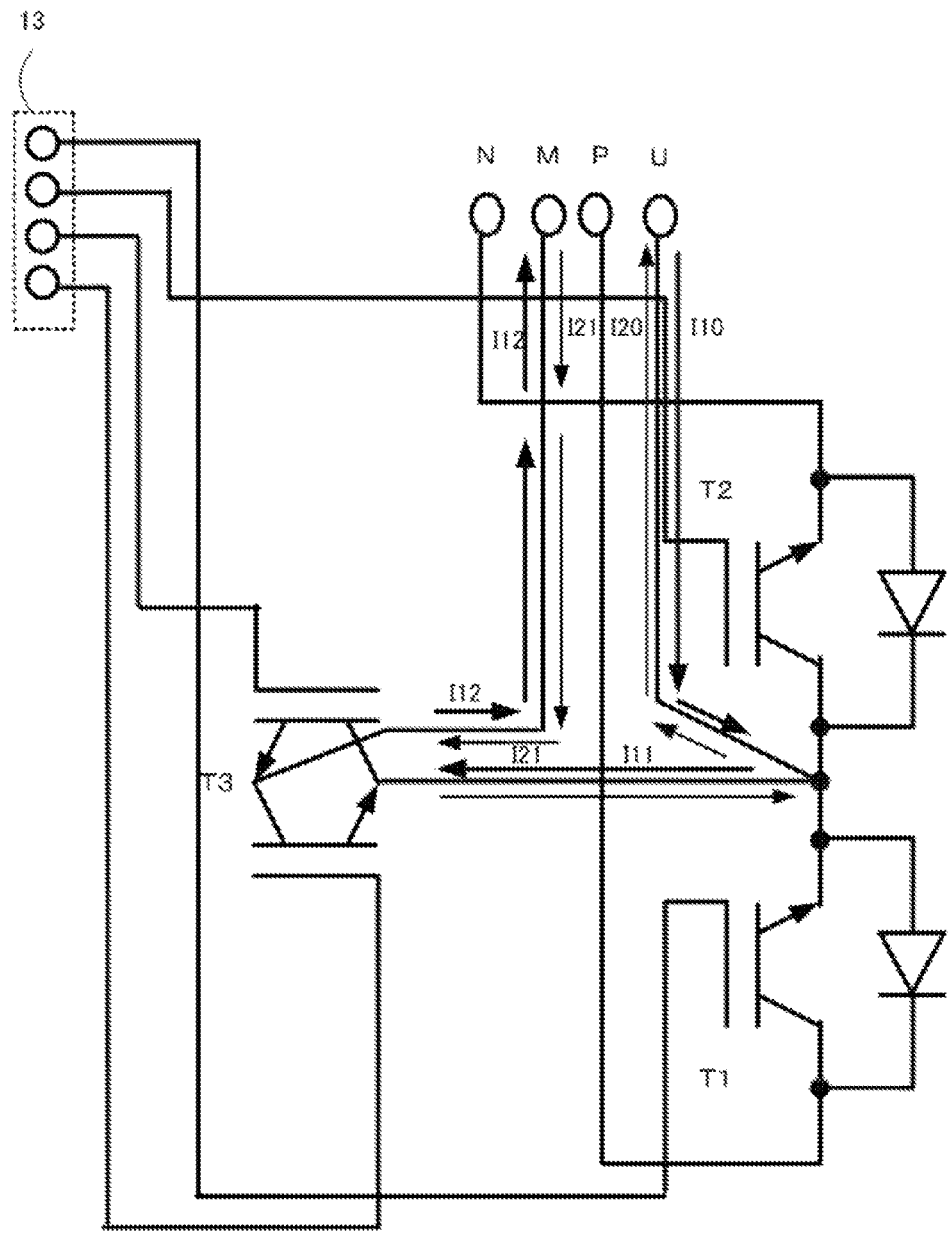
FIG. 17 is the equivalent circuit diagram that considers the chip arrangement in FIG. 14(a)

FIG. 14(*a*) is the top plan view of a power semiconductor module according to a second embodiment of the invention. FIG. 14(*b*) is the side plan view of the power semiconductor module according to the second embodiment. FIG. 15 is the top plan view of a case showing the terminal arrangement thereon. FIG. 16 is the top plan view of the power semiconductor module according to the second embodiment describing the current paths therein. FIG. 17 is the equivalent circuit diagram that considers the chip arrangement in FIG. 14(*a*).

Power semiconductor module 200 shown in FIGS. 14(*a*) and 14(*b*) is the same with power semiconductor module 100 shown in FIGS. 1(*a*) and 1(*b*) in that power semiconductor module 200 employs same insulated substrates 1, 2, 3, and 4; IGBT chips 5a and 5b; FWD chips 6a and 6b; and reverse blocking IGBT chips 7a and 7b. Power semiconductor module 200 is different from power semiconductor module 100 in that U-terminal 8 is shifted to the P-terminal 10 side and control terminals 13 to the N-terminal 11 side as described in FIGS. 14(*a*), 14(*b*), and 15. Therefore, N-terminal 11, M-terminal 9, and P-terminal 10 are arranged in the order of the above description from the control electrodes 13 side. U-terminal 8 is arranged beside P-terminal 10. Insulated substrates 3 and 4, to which reverse blocking IGBT's 7a and 7b are fixed, are arranged along the inner side wall of case 17 opposite to the side wall thereof, to which control electrodes 13 are fixed.

Due to the configurations described above, the direction of current 110 that flows through U-terminal 8 and the direction of current I20 that flows through U-terminal 8 are opposite to each other, and the direction of current I21 that flows through M-terminal 9 and the direction of current I12 that flows through M-terminal 9 are opposite to each other. Therefore the mutual inductance is made to be smaller that the mutual inductance in the power semiconductor module shown in FIG. 1(a).

As described in FIG. 15, the distance L2 between exposed connector end section 8a of U-terminal 8 and control electrodes 13 is the same with the distance between exposed connector end section 10a of P-terminal 10 and control electrodes 13. However, the distance L2 is longer than the distance between exposed connector end section 9a or 11a and control electrodes 13. Therefore, the noises radiated from U-terminal 8 and introduced into control electrodes 13 are reduced.

Since the currents caused by the regenerating operation in power semiconductor module 200 flow through the similar paths as those in FIG. 12, the mutual inductance is small in the same manner as in FIG. 12.

Since insulated substrates 3 and 4 are arranged as described above and reverse blocking IGBT chips 7a and 7b are arranged on the electrical-conductor patterns on the control electrode 13 side, it is possible to make M-terminal 9 cross over U-terminal 8. Therefore, it is possible to reduce the mutual inductance in the module.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments can be combined, as would be understood by one of skill in the art.

This application is based on, and claims priority to, Japanese Patent Application No. 2010-255765, filed on Nov. 16, 2010. The disclosure of the priority application, in its entirety, including the drawings, claims, and the specification thereof, is incorporated herein by reference.

What is claimed is:

1. A power semiconductor module for use with a first power supply, a second power supply and a load, the power semiconductor module comprising:
   a case;
   a first circuit comprising a first IGBT and a first diode connected in opposite parallel to each other, the first circuit constituting an upper arm;
   a second circuit comprising a second IGBT and a second diode connected in opposite parallel to each other, the second circuit constituting a lower arm;
   an intermediate circuit comprising a first reverse blocking IGBT and a second reverse blocking IGBT connected in opposite parallel to each other;
   a control terminal, the control terminal being connected to gates of the first IGBT, the second IGBT, the first reverse blocking IGBT and the second reverse blocking IGBT;
   an output terminal connecting a third connection point, a collector of the first reverse blocking IGBT and an emitter of the second reverse blocking IGBT to each other;
   an intermediate terminal connecting a first connection point, an emitter of the first reverse blocking IGBT and a collector of the second reverse blocking IGBT to each other, the intermediate terminal configured to connect the first power supply and the second power supply in series to each other at the first connection point;
   a first end of the first circuit configured to be connected to a high-potential-side of the first power supply at a second connection point;
   a second end of the first circuit, the second circuit, and the intermediate circuit configured to be connected to the load at the third connection point;
   the second circuit configured to be connected to a low-potential-side of the second power supply at a fourth connection point; and
   the output terminal and the intermediate terminal overlapping each other in the case.

2. The power semiconductor module according to claim 1, the power semiconductor module further comprising:
   a P-terminal connected to the second connection point, the P-terminal connecting the first connection point, via the first power supply, to a collector of the first IGBT and a cathode of the first diode to each other;
   an N-terminal connecting the fourth connection point, an emitter of the second IGBT and an anode of the second diode;
   an M-terminal working as the intermediate terminal, and configured to be connected to a low-potential side of the first power supply;
   and
   a U-terminal, a V-terminal, or a W-terminal working as the output terminal.

3. The power semiconductor module according to claim 1, the power semiconductor module further comprising:
   a P-terminal connected to the second connection point, the P-terminal connecting the first connection point, via the first power supply, to a collector of the first IGBT and a cathode of the first diode to each other, the P-terminal comprising a connector end section exposed outside the case;
   an N-terminal connecting the fourth connection point, an emitter of the second IGBT and an anode of the second diode, the N-terminal comprising a connector end section exposed outside the case;
   an M-terminal working as the intermediate terminal, and configured to be connected to a low-potential side of the first power supply, the M-terminal comprising a connector end section exposed outside the case;
   a U-terminal, a V-terminal, or a W-terminal working as the output terminal, the output terminal comprising a connector end section exposed outside the case;
   and
   the exposed connector end sections of the P-terminal, the M-terminal, the N-terminal, and the output terminal being arranged farther away from the control terminals in the order of the description.

4. The power semiconductor module according to claim 3, wherein
the connector end sections of the P-terminal, the M-terminal, the N-terminal, and the output terminal are aligned farther away from the control terminals in the order of the description.

5. The power semiconductor module according to claim 1, the power semiconductor module further comprising:
a P-terminal connected to the second connection point, the P-terminal connecting the first connection point, via the first power supply, to a collector of the first IGBT and a cathode of the first diode to each other, the P-terminal comprising a connector end section exposed outside the case;
an N-terminal connecting the fourth connection point, an emitter of the second IGBT and an anode of the second diode, the N-terminal comprising a connector end section exposed outside the case;
an M-terminal working as the intermediate terminal, and configured to be connected to a low-potential side of the first power supply, the M-terminal comprising a connector end section exposed outside the case;
a U-terminal, a V-terminal, or a W-terminal working as the output terminal, the output terminal comprising a connector end section exposed outside the case;
the exposed connector end sections of the N-terminal, the M-terminal, and the P-terminal being arranged farther away from the control terminals in the order of the description;
the exposed connector end sections of the N-terminal, the M-terminal, and the P-terminal being aligned;
and
the exposed connector end section of the output terminal being arranged beside the exposed connector end section of the P-terminal.

6. The power semiconductor module according to claim 1, wherein
the first IGBT and the first diode are fixed to a first insulated substrate;
the second IGBT and the second diode are fixed to a second insulated substrate;
the first reverse blocking IGBT is fixed to a third insulated substrate;
the second reverse blocking IGBT is fixed to a fourth insulated substrate;
and
the first through fourth insulated substrates comprise a same electrical-conductor pattern formed thereon.

7. The power semiconductor module according to claim 6, wherein
the control electrodes are fixed along a first side wall of the case; and
the first reverse blocking IGBT and the second reverse blocking IGBT are fixed to the electrical-conductor patterns arranged along the first side wall of the case or to the electrical-conductor patterns arranged along a second side wall of the case facing to the first side wall of the case.

* * * * *